(12) United States Patent
Yoshida et al.

(10) Patent No.: US 11,139,808 B2
(45) Date of Patent: Oct. 5, 2021

(54) SEMICONDUCTOR DEVICE AND POWER CONVERSION SYSTEM

(71) Applicant: Mitsubishi Electric Corporation, Tokyo (JP)

(72) Inventors: Kentaro Yoshida, Tokyo (JP); Kazuaki Hiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 79 days.

(21) Appl. No.: 16/473,236

(22) PCT Filed: Feb. 28, 2017

(86) PCT No.: PCT/JP2017/007708
§ 371 (c)(1),
(2) Date: Jun. 24, 2019

(87) PCT Pub. No.: WO2018/158807
PCT Pub. Date: Sep. 7, 2018

(65) Prior Publication Data
US 2019/0372567 A1    Dec. 5, 2019

(51) Int. Cl.
*H03K 17/0812* (2006.01)
*H02M 1/32* (2007.01)
(Continued)

(52) U.S. Cl.
CPC ........ *H03K 17/08128* (2013.01); *H02M 1/32* (2013.01); *H02M 7/53871* (2013.01); *H02P 27/08* (2013.01)

(58) Field of Classification Search
CPC .............. H03K 17/08128; H02M 1/32; H02M 7/53871; H02P 27/08
(Continued)

(56) References Cited

U.S. PATENT DOCUMENTS 6,633,473 B1 * 10/2003 Tomomatsu ........ H01L 29/7395
                                                            361/93.7
2002/0181180 A1 * 12/2002 Ivanov ................... H03F 1/523
                                                            361/93.9
(Continued)

FOREIGN PATENT DOCUMENTS

JP        H05-276761 A    10/1993
JP        2014-064355 A    4/2014
JP          5726037 B2     5/2015

OTHER PUBLICATIONS

An Office Action mailed by the Japanese Patent Office dated Dec. 3, 2019, which corresponds to Japanese Patent Application No. 2019-502311 and is related to U.S. Appl. No. 16/473,236; with English language translation.
(Continued)

*Primary Examiner* — Yemane Mehari
(74) *Attorney, Agent, or Firm* — Studebaker & Brackett PC

(57) ABSTRACT

To suppress a malfunction of an overcurrent protection circuit caused by rise of a sense voltage in a mirror period immediately after turn-off of a semiconductor switching element. A semiconductor device includes: a semiconductor switching element; a sense resistor; an overcurrent protection circuit which outputs a control signal for controlling on-drive and off-drive of the semiconductor switching element based on whether a sense voltage exceeds a threshold value; and a diode which clamps the sense voltage. When the sense voltage exceeds the threshold value, the overcurrent protection circuit outputs a signal for off-driving the semiconductor switching element as the control signal.

10 Claims, 14 Drawing Sheets

(51) Int. Cl.
*H02M 7/5387* (2007.01)
*H02P 27/08* (2006.01)

(58) Field of Classification Search
USPC .......................................... 361/57
See application file for complete search history.

(56) References Cited

U.S. PATENT DOCUMENTS

2013/0083442 A1* 4/2013 Hiyama ............. H03K 17/0828
361/93.7
2019/0190514 A1* 6/2019 Ohashi ............. H03K 17/08128

OTHER PUBLICATIONS

International Preliminary Report on Patentability issued in PCT/JP2017/007708; dated Sep. 3, 2019.

* cited by examiner

F I G. 1 3
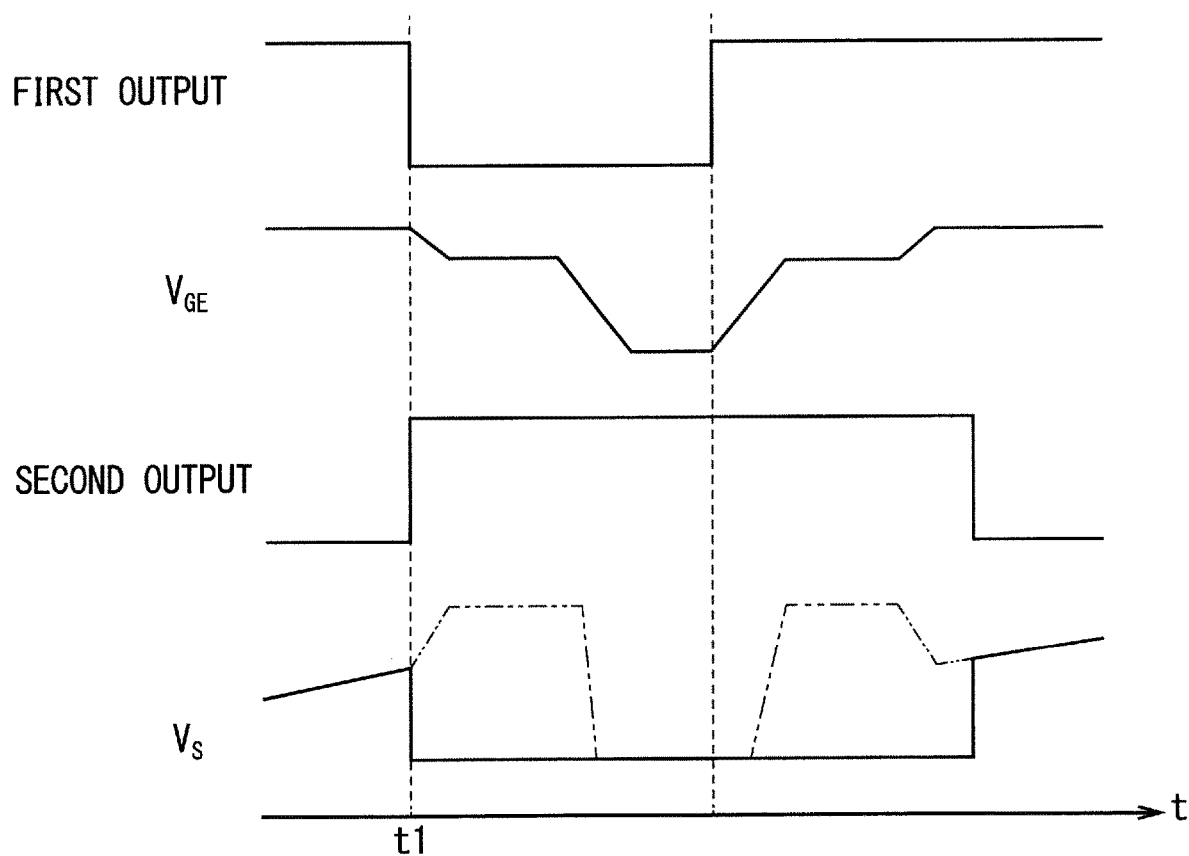

SEMICONDUCTOR DEVICE AND POWER CONVERSION SYSTEM

TECHNICAL FIELD

A technique disclosed in the present specification relates to a technique for suppressing a malfunction of a circuit for protecting a semiconductor switching element from an overcurrent.

BACKGROUND ART

Conventionally, in an overcurrent protection circuit of a semiconductor switching element including a sense element, a sense current output from the sense element is converted into a sense voltage by a resistor or the like and used to detect an overcurrent.

When the sense voltage exceeds a certain threshold value, a comparator in the overcurrent protection circuit detects the sense voltage. Then, by blocking a gate of the semiconductor switching element, the semiconductor switching element is protected from an overcurrent of the circuit.

By the way, immediately after turn-on and immediately after turn-off of a semiconductor switching element such as an insulated gate bipolar transistor (that is, IGBT) or a metal-oxide-semiconductor field-effect transistor (that is, MOSFET), there is a period called "mirror period".

In the above mirror period, in addition to a fact that a gate driving current of the semiconductor switching element charges and discharges between a gate and an emitter, the gate driving current of the semiconductor switching element charges and discharges a capacitance between the gate and a collector. Therefore, a voltage between the gate and the emitter becomes constant.

When the semiconductor switching element is in the mirror period, the sense voltage tends to increase as compared to that in a normal operation. Therefore, a malfunction of the overcurrent protection circuit due to the increase of the sense voltage is prevented by providing a low pass filter or the like.

For example, Patent Document 1 (Japanese Patent No. 5726037) discloses a circuit that prevents a malfunction of an overcurrent protection circuit by adjusting a threshold value or a sense voltage of the overcurrent protection circuit during a mirror period immediately after a semiconductor switching element is turned on.

Also, for example, Patent Document 2 (Japanese Patent Application Laid-Open No. 5-276761 (1993)) discloses a technique in which, regarding a malfunction of an overcurrent protection circuit caused by rise of a sense voltage of semiconductor switching elements connected in parallel, by paying attention to nonuniformity in switching characteristics and a reverse recovery current, a sense current is bypassed by a semiconductor switch for a fixed period after the semiconductor switching elements are turned on and turned off.

PRIOR ART DOCUMENTS

Patent Documents

Patent Document 1: Japanese Patent No. 5726037
Patent Document 2: Japanese Patent Application Laid-Open No. 5-276761 (1993)

SUMMARY

Problem to be Solved by the Invention

In the conventional overcurrent protection circuit, attention is paid to rise of a sense voltage in a mirror period immediately after turn-on of a semiconductor switching element, and means for preventing a malfunction of overcurrent protection is taken. On the other hand, rise of the sense voltage in the mirror period immediately after turn-off of the semiconductor switching element is not considered very much.

This is because, though the sense voltage rises even during the mirror period immediately after the turn-off of the semiconductor switching element as well as during the mirror period immediately after the turn-on of the semiconductor switching element, since detection of the overcurrent protection circuit during the turn-off of the semiconductor switching element is usually masked, there is no possibility of malfunctioning.

However, for example, in the case of an operation pattern in which the semiconductor switching element is turned off and in the middle of the mirror period immediately after the turn-off or immediately after the end of the mirror period, the semiconductor switching element is turned on again, rise of the sense voltage in the mirror period immediately after the turn-off of the semiconductor switching element may become a problem.

In such an operation pattern, the sense voltage which has risen in the mirror period immediately after the turn-off of the semiconductor switching element remains even when the semiconductor switching element is turned on. Therefore, simultaneously with the turn-on of the semiconductor switching element, the sense voltage which has risen in the mirror period causes the overcurrent protection circuit to malfunction.

Here, in the above-mentioned Patent Document 2 (Japanese Patent Application Laid-Open No. 5-276761 (1993)), the malfunction of the overcurrent protection circuit is prevented by bypassing the sense current immediately after the semiconductor switching element is turned off for a certain period. However, an object of Patent Document 2 (Japanese Patent Application Laid-Open No. 5-276761 (1993)) is the rise of the sense voltage due to the nonuniformity of the semiconductor switching element or the reverse recovery current. A rising period of the sense voltage due to these factors is generally shorter than the mirror period. Therefore, when the rise of the sense voltage in the mirror period occurs as described above, if a bypass operation of the sense current is performed by a bypass circuit in Patent Document 2 (Japanese Patent Application Laid-Open No. 5-276761 (1993)), a length of a bypass period is not sufficient. In other words, the overcurrent protection circuit may malfunction.

A technique disclosed in the present specification is made to solve the problems as described above, and it is an object of the present invention to provide a technique capable of suppressing a malfunction of an overcurrent protection circuit caused by rise of a sense voltage in a mirror period immediately after a semiconductor switching element is turned off.

Means to Solve the Problem

A first aspect of the technique disclosed in the present specification includes: a semiconductor switching element; a sense resistor which converts a sense current divided from a main current flowing to the semiconductor switching element into a sense voltage; an overcurrent protection circuit which outputs a control signal for controlling on-drive and off-drive of the semiconductor switching element based on whether the sense voltage exceeds a predetermined threshold value; and a diode which clamps the sense voltage to a voltage obtained by adding a forward voltage to a voltage of a signal output from the overcurrent protection circuit to the semiconductor switching element at a time of off-drive, wherein the overcurrent protection circuit outputs, based on an input signal, a signal for on-driving or a signal for off-driving the semiconductor switching element as the control signal when the sense voltage does not exceed the threshold value, and outputs a signal for off-driving the semiconductor switching element as the control signal when the sense voltage exceeds the threshold value.

A second aspect of the technique disclosed in the present specification includes: a power conversion apparatus including the above-described semiconductor device; a power supply connected to the power conversion apparatus; and a load connected to the power conversion apparatus, and an output of the power supply being input after being converted in the power conversion apparatus.

A third aspect of the technique disclosed in the present specification includes: a semiconductor switching element; a sense resistor which converts a sense current divided from a main current flowing to the semiconductor switching element into a sense voltage; a clamp circuit which clamps the sense voltage; a determination circuit which determines whether the sense voltage exceeds a predetermined threshold value; and a control unit which controls on-drive and off-drive of the semiconductor switching element and drive of the clamp circuit based on a determination result in the determination circuit, wherein the control unit on-drives or off-drives the semiconductor switching element based on an input signal when the sense voltage does not exceed the threshold value, off-drives the semiconductor switching element when the sense voltage exceeds the threshold value, and causes the clamp circuit to clamp the sense voltage at least during a period when the semiconductor switching element is off-driven and a predetermined period after the period.

A fourth aspect of the technique disclosed in the present specification includes: a power conversion apparatus including the above-described semiconductor device; a power supply connected to the power conversion apparatus; and a load connected to the power conversion apparatus, and an output of the power supply being input after being converted in the power conversion apparatus.

Effects of the Invention

The first aspect of the technique disclosed in the present specification includes: a semiconductor switching element; a sense resistor which converts a sense current divided from a main current flowing to the semiconductor switching element into a sense voltage; an overcurrent protection circuit which outputs a control signal for controlling on-drive and off-drive of the semiconductor switching element based on whether the sense voltage exceeds a predetermined threshold value; and a diode which clamps the sense voltage to a voltage obtained by adding a forward voltage to a voltage of a signal output from the overcurrent protection circuit to the semiconductor switching element at a time of off-drive, wherein the overcurrent protection circuit outputs, based on an input signal, a signal for on-driving or a signal for off-driving the semiconductor switching element as the control signal when the sense voltage does not exceed the threshold value, and outputs a signal for off-driving the semiconductor switching element as the control signal when the sense voltage exceeds the threshold value. According to such a configuration, it is possible to appropriately suppress a malfunction of the overcurrent protection circuit caused by rise of the sense voltage immediately after the semiconductor switching element is turned off. Specifically, while the signal for off-driving the semiconductor switching element is output by the overcurrent protection circuit, the diode clamps the sense voltage based on the signal, so that the overcurrent protection circuit is prevented from malfunctioning due to the rise of the sense voltage in a period after the semiconductor switching element is turned off. In addition, since the sense voltage is clamped using the signal output from the overcurrent protection circuit to the semiconductor switching element at the time of off-drive, the number of output terminals and the number of parts can be reduced as compared with a case where a clamp circuit for clamping a sense voltage is separately mounted.

The second aspect of the technique disclosed in the present specification includes: a power conversion apparatus including the above-described semiconductor device; a power supply connected to the power conversion apparatus; and a load connected to the power conversion apparatus, and an output of the power supply being input after being converted in the power conversion apparatus. According to such a configuration, the power conversion apparatus includes the above-described semiconductor device including the diode. Therefore, by the operation of the diode, reliability of the semiconductor switching element can be enhanced while suppressing a malfunction in a determination circuit and a malfunction in a control unit.

The third aspect of the technique disclosed in the specification includes: a semiconductor switching element; a sense resistor which converts a sense current divided from a main current flowing to the semiconductor switching element into a sense voltage; a clamp circuit which clamps the sense voltage; a determination circuit which determines whether the sense voltage exceeds a predetermined threshold value; and a control unit which controls on-drive and off-drive of the semiconductor switching element and drive of the clamp circuit based on a determination result in the determination circuit, wherein the control unit on-drives or off-drives the semiconductor switching element based on an input signal when the sense voltage does not exceed the threshold value, off-drives the semiconductor switching element when the sense voltage exceeds the threshold value, and causes the clamp circuit to clamp the sense voltage at least during a period when the semiconductor switching element is off-driven and a predetermined period after the period. According to such a configuration, it is possible to properly suppress a malfunction of an overcurrent protection circuit caused by rise of the sense voltage immediately after the semiconductor switching element is turned off and also a malfunction of the overcurrent protection circuit caused by rise of the sense voltage in a mirror period immediately after the semiconductor switching element is turned on.

The fourth aspect of the technique disclosed in the present specification includes: a power conversion apparatus including the above-described semiconductor device; a power supply connected to the power conversion apparatus; and a load connected to the power conversion apparatus, and an output of the power supply being input after being converted in the power conversion apparatus. According to such a configuration, the power conversion apparatus includes the above-described semiconductor device including the clamp circuit. Therefore, by the operation of the clamp circuit, reliability of the semiconductor switching element can be enhanced while suppressing a malfunction in a determination circuit and a malfunction in a control unit.

The objects, features, aspects, and advantages of the technique disclosed in the present specification will become more apparent from the detailed description given below and the accompanying drawings.

BRIEF DESCRIPTION OF DRAWINGS

FIG. 13 is a timing chart illustrating an operation of a semiconductor device according to an embodiment.

DESCRIPTION OF EMBODIMENTS

Figure 1:
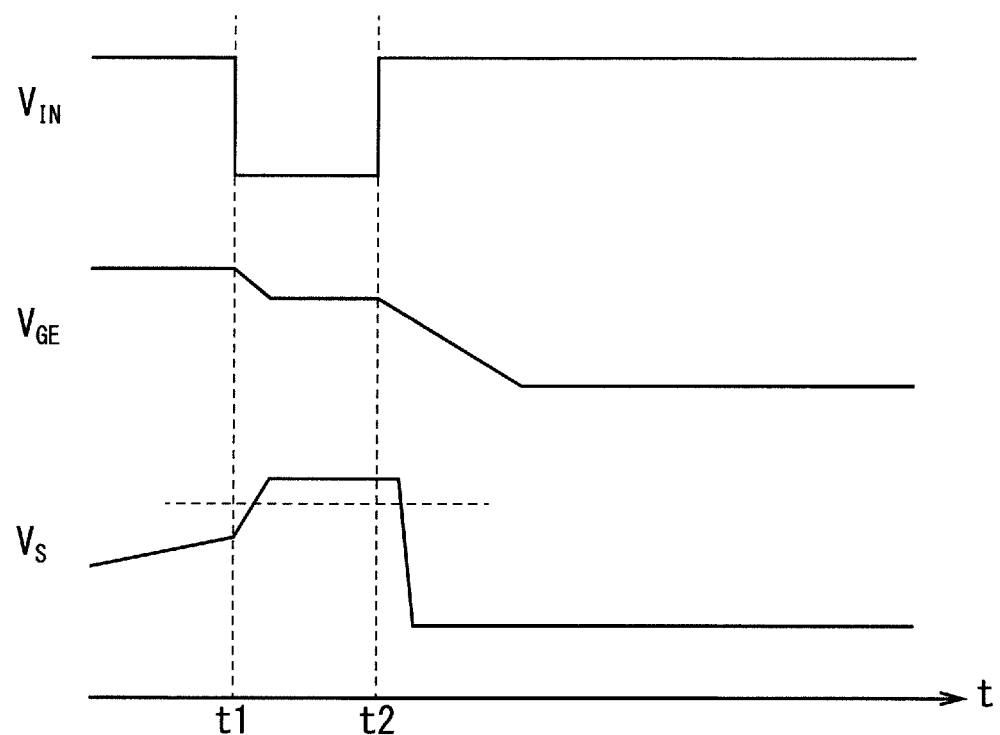
FIG. 1 is a timing chart illustrating an operation pattern in which a sense voltage $V_S$ rises in a mirror period immediately after turn-off of a semiconductor switching element according to an embodiment.

Hereinafter, embodiments will be described with reference to the accompanying drawings.

It should be noted that the drawings are schematically shown and, and for convenience of description, omission of a configuration or simplification of the configuration is made as appropriate. Also, a mutual relationship between sizes and positions of configurations and the like shown in different drawings is not necessarily described accurately and can be appropriately changed.

In addition, in the following description, the same components are denoted by the same reference numerals, and they have the same names and functions. Therefore, detailed description thereof may be omitted in order to avoid duplication.

First Embodiment

A semiconductor device according to the present embodiment will be described below. For convenience of description, first, a case where rise of a sense voltage in a mirror period immediately after turn-off of a semiconductor switching element becomes a problem will be described.

FIG. 1 is a timing chart illustrating an operation pattern in which a sense voltage rises in a mirror period immediately after a semiconductor switching element is turned off. In FIG. 1, a horizontal axis represents time.

Assume that the operation pattern as illustrated in FIG. 1, that is, an operation pattern in which the semiconductor switching element is turned off at time t1 and the semiconductor switching element is turned on again at time t2 in the middle of the mirror period immediately after the turn-off or immediately after the end of the mirror period.

An input voltage $V_{IN}$ switches from a High level voltage signal to a Low level voltage signal at a turn-off timing of the semiconductor switching element, that is, the time t1. Then, the voltage $V_{IN}$ switches from the Low level voltage signal to the High level voltage signal at a turn-on timing of the semiconductor switching element, that is, the time t2. Note that an overcurrent protection circuit does not operate while the semiconductor switching element is in a turn-off state.

A sense voltage $V_S$ rises at the turn-off timing of the semiconductor switching element, that is, the time t1. Then, the sense voltage $V_S$ is maintained at an increased voltage value even at the turn-on timing of the semiconductor switching element, that is, the time t2.

In the case of such an operation pattern, the sense voltage $V_S$ which has risen in the mirror period immediately after the turn-off of the semiconductor switching element remains even at the turn-on of the semiconductor switching element, that is, the time t2. Therefore, at the same time as the semiconductor switching element is turned on, the sense voltage $V_S$ risen in the mirror period causes the overcurrent protection circuit to malfunction.

Due to the malfunction of the overcurrent protection circuit, a voltage $V_{GE}$ between a gate and an emitter is switched to a Low level voltage signal.

In the above-mentioned Patent Document 2 (Japanese Patent Application Laid-Open No. 5-276761 (1993)), the malfunction of the overcurrent protection circuit is prevented by bypassing the sense current immediately after the semiconductor switching element is turned off for a certain period. However, the object of Patent Document 2 (Japanese Patent Application Laid-Open No. 5-276761 (1993)) is the rise of the sense voltage $V_S$ due to the nonuniformity of the semiconductor switching element or the reverse recovery current. The rising period of the sense voltage $V_S$ due to these factors is generally shorter than the mirror period. Therefore, when the rise of the sense voltage $V_S$ in the mirror period as described above occurs, the length of the bypass operation period of the sense current by the bypass circuit is insufficient, and the overcurrent protection circuit may also malfunction.

<Configuration of Semiconductor Device>

Figure 2:
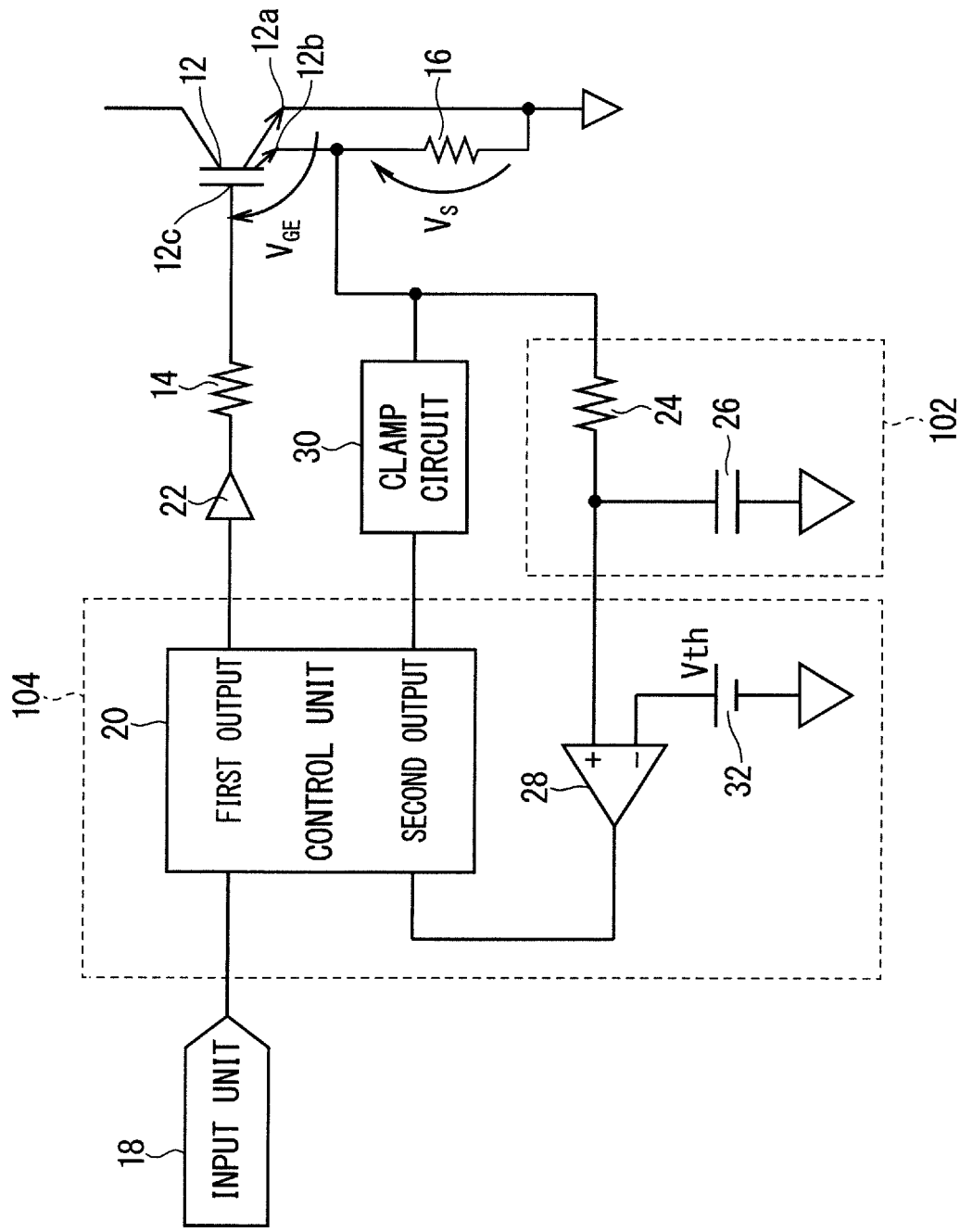
FIG. 2 is a diagram schematically illustrating a circuit configuration for realizing a semiconductor device according to the embodiment.

FIG. 2 is a diagram schematically illustrating a circuit configuration for realizing the semiconductor device according to the present embodiment. Note that from the viewpoint of making the configuration easy to understand, some components may be omitted or simplified in FIG. 2.

As illustrated in FIG. 2, the semiconductor device includes a semiconductor switching element 12 to be subjected to overcurrent protection, a gate resistor 14, a sense resistor 16, a buffer circuit 22, a clamp circuit 30, a low pass filter 102, and an overcurrent protection circuit 104.

The semiconductor switching element 12 is a transistor such as an IGBT, for example, including a current sense terminal 12b together with an emitter terminal 12a. A collector current of the semiconductor switching element 12, that is, a sense current proportional to a main current flows through the current sense terminal 12b.

The semiconductor switching element 12, for example, is turned on when a driving signal input to a gate terminal 12c is a High level voltage signal, and is turned off when the driving signal input to the gate terminal 12c is a Low level voltage signal.

The gate resistor 14 is connected to the gate terminal 12c of the semiconductor switching element 12. The sense resistor 16 converts the sense current into the sense voltage $V_S$. The sense resistor 16 is connected between the emitter terminal 12a and the current sense terminal 12b of the semiconductor switching element 12. The sense resistor 16 also converts the sense current divided from the main current flowing to the semiconductor switching element 12 into a voltage.

The buffer circuit 22 generates a driving signal input to the gate terminal 12c of the semiconductor switching element 12 based on a signal input from an input unit 18 via the overcurrent protection circuit 104.

The clamp circuit 30 clamps rise of the sense voltage $V_S$, that is, fixes the sense voltage $V_S$ to a voltage having a constant value.

The low pass filter 102 includes a resistor 24 and a capacitor 26.

The overcurrent protection circuit 104 includes a control unit 20, a comparator 28, and a reference voltage source 32. The overcurrent protection circuit 104 monitors the main current flowing to the semiconductor switching element 12 based on the sense voltage $V_S$ input via the low pass filter 102.

The overcurrent protection circuit 104 normally transmits a signal input from the input unit 18 to the buffer circuit 22. On the other hand, when detecting that an overcurrent flows to the semiconductor switching element 12, the overcurrent protection circuit 104 performs a protection operation of the semiconductor switching element 12 such as not transmitting a signal to the buffer circuit 22.

The reference voltage source 32 outputs a reference voltage $V_{th}$ corresponding to a threshold value of the sense voltage $V_S$ at which the overcurrent protection circuit 104 starts the protection operation of the semiconductor switching element 12.

The sense voltage $V_S$ is input to a non-inverting input terminal, that is, a +terminal of the comparator 28 via the low pass filter 102. On the other hand, the reference voltage source 32 is connected to an inverting input terminal, that is, a −terminal of the comparator 28.

An output of the comparator 28 becomes a Low level voltage signal when the sense voltage $V_S$ input to the +terminal is lower than the reference voltage $V_{th}$ input to the −terminal, and becomes a High level voltage signal when the sense voltage $V_S$ input to the +terminal is higher than the reference voltage $V_{th}$ input to the −terminal. The output of the comparator 28 is input to the control unit 20.

A signal is input to the control unit 20 from the input unit 18. When the output signal from the comparator 28 is the Low level voltage signal, the control unit 20 outputs, from a first output, a signal based on the signal input from the input unit 18. On the other hand, when the output signal from the comparator 28 is the High level voltage signal, the control unit 20 outputs, from the first output, a control signal for blocking the gate of the switching element, that is, a Low level voltage signal. By doing so, the control unit 20 protects the semiconductor switching element 12 from an overcurrent.

Further, the control unit 20 outputs a signal for controlling the clamp circuit 30 from a second output. When the Low level voltage signal is output from the first output, the control unit 20 outputs a High level voltage signal from the second output.

The clamp circuit 30 branches from and is connected to a path where the sense voltage $V_S$ is input to the low pass filter 102, and is connected to the second output of the control unit 20. The clamp circuit 30 clamps the rise of the sense voltage $V_S$ when the High level voltage signal is input from the second output of the control unit 20. On the other hand, the clamp circuit 30 stops operation when a Low level voltage signal is input from the second output of the control unit 20.

Figure 3:
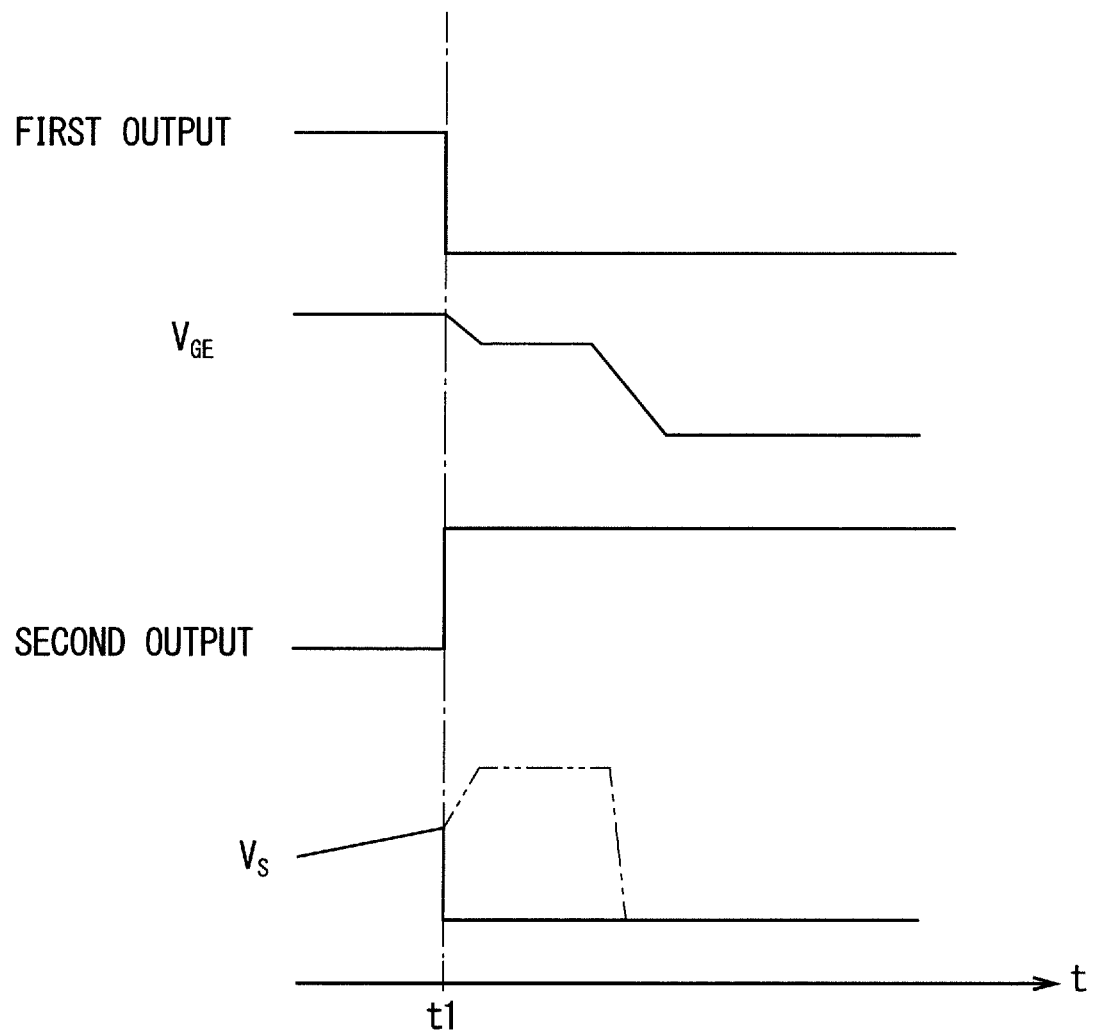
FIG. 3 is a timing chart illustrating an operation of the semiconductor device illustrated in FIG. 2.

FIG. 3 is a timing chart illustrating the operation of the semiconductor device illustrated in FIG. 2. In FIG. 3, a horizontal axis represents time.

As illustrated in FIG. 3, while the Low level voltage signal is output from the first output of the control unit 20, by outputting the High level voltage signal from the second output, the clamp circuit 30 is continuously driven. By doing so, the rise of the sense voltage $V_S$ in the mirror period immediately after the turn-off of the semiconductor switching element 12 is clamped, that is, the sense voltage $V_S$ is fixed to the voltage having the constant value, so that a malfunction of the overcurrent protection circuit can be suppressed.

Note that in a waveform representing a voltage value of the sense voltage $V_S$, a portion represented by a dotted line represents a waveform of the sense voltage $V_S$ when the clamp circuit 30 does not operate.

Second Embodiment

A semiconductor device according to the present embodiment will be described. In the following description, the same components as those described in the above-described embodiment are denoted by the same reference numerals, and detailed description thereof is appropriately omitted.

<Configuration of Semiconductor Device>

Figure 4:
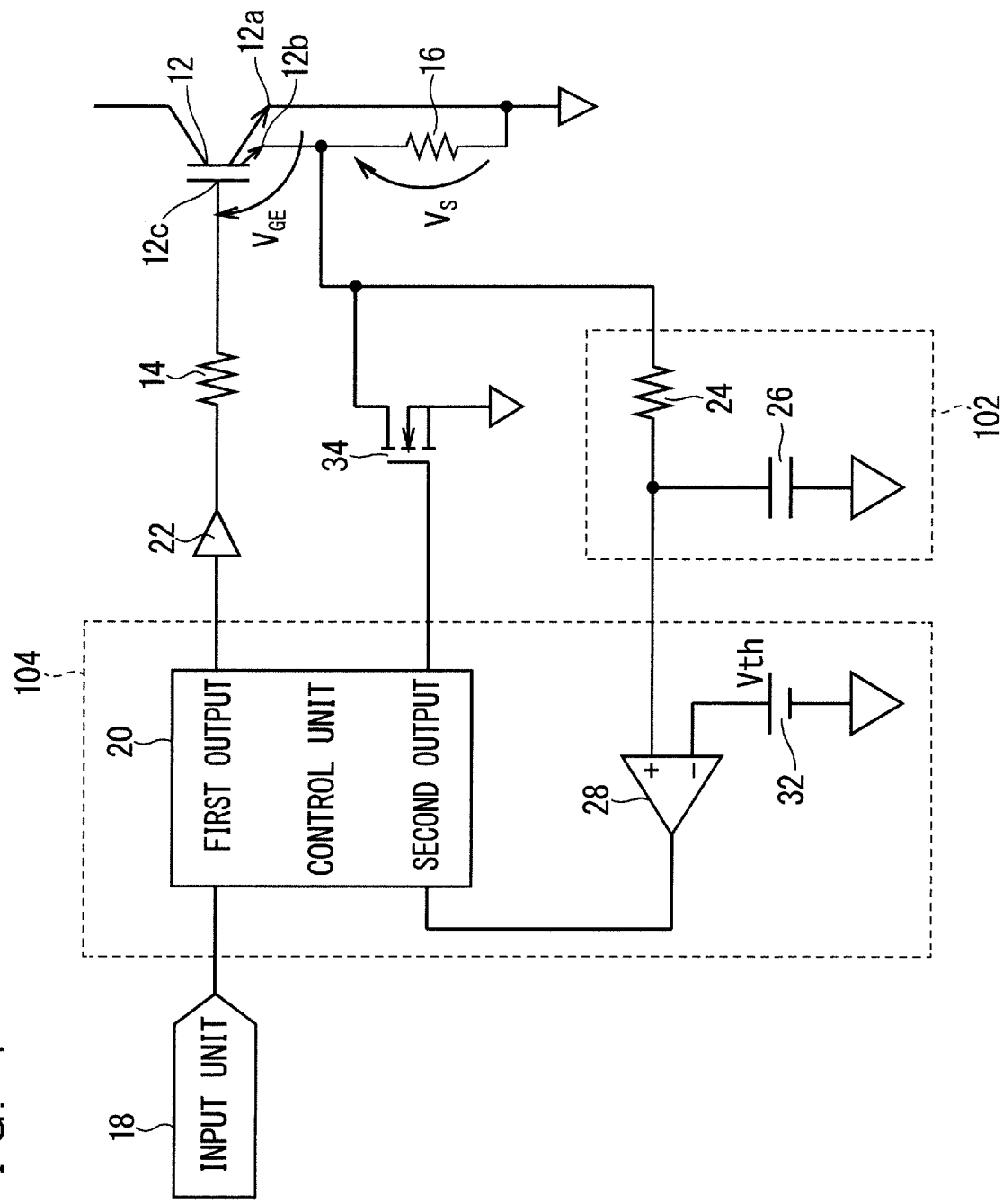
FIG. 4 is a diagram schematically illustrating a circuit configuration for realizing a semiconductor device according to an embodiment.

FIG. 4 is a diagram schematically illustrating a circuit configuration for realizing the semiconductor device according to the present embodiment.

As illustrated in FIG. 4, the semiconductor device includes a semiconductor switching element 12, a gate resistor 14, a sense resistor 16, a buffer circuit 22, a MOSFET 34, a low pass filter 102, and an overcurrent protection circuit 104.

The MOSFET 34 functions as a clamp circuit. Note that, for example, a bipolar transistor can also be used as a configuration functioning as the clamp circuit.

The MOSFET 34 branches from a path where a sense voltage $V_S$ is input to the low pass filter 102 while being connected to a drain terminal, has a source terminal connected to ground, and has a gate terminal connected to a second output of a control unit 20. Note that when a bipolar transistor is provided instead of the MOSFET 34, it branches from a path where the sense voltage $V_S$ is input to the low pass filter 102 while being connected to a collector terminal, has an emitter terminal connected to the ground, and has a base terminal connected to the second output of the control unit 20. When a High level voltage signal is input from the second output of the control unit 20, the MOSFET 34 clamps the sense voltage $V_S$ to the ground.

Figure 5:
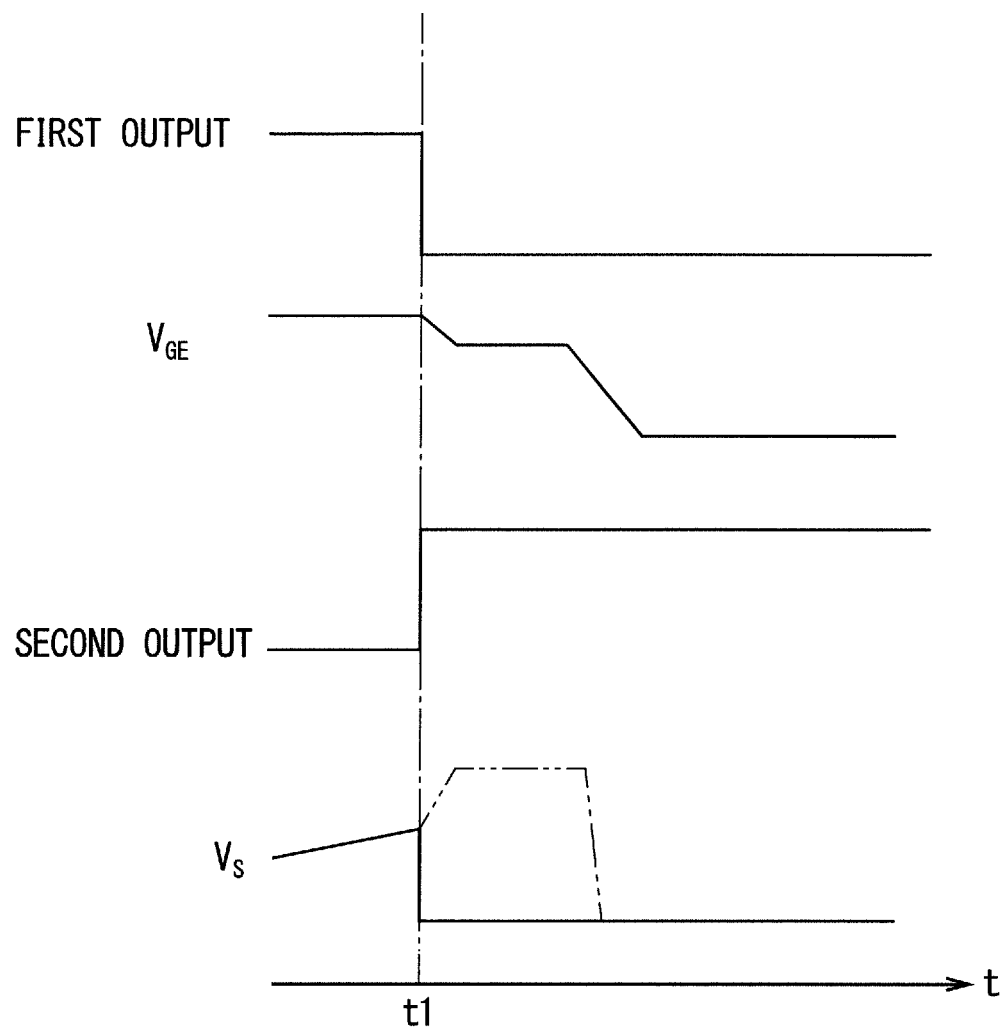
FIG. 5 is a timing chart illustrating an operation of the semiconductor device illustrated in FIG. 4.

FIG. 5 is a timing chart illustrating an operation of the semiconductor device illustrated in FIG. 4. In FIG. 5, a horizontal axis represents time.

As illustrated in FIG. 5, while a Low level voltage signal is output from a first output of the control unit 20, the MOSFET 34 is continuously driven by outputting the High level voltage signal from the second output. By doing so, rise of the sense voltage $V_S$ in a mirror period immediately after turn-off of the semiconductor switching element 12 is clamped, and a malfunction of the overcurrent protection circuit can be suppressed.

Note that in a waveform representing a voltage value of the sense voltage $V_S$, a portion represented by a dotted line represents a waveform of the sense voltage $V_S$ when the MOSFET 34 does not operate.

Third Embodiment

A semiconductor device according to the present embodiment will be described. In the following description, the same components as those described in the above-described embodiments are denoted by the same reference numerals, and detailed description thereof is appropriately omitted.

<Configuration of Semiconductor Device>

Figure 6:
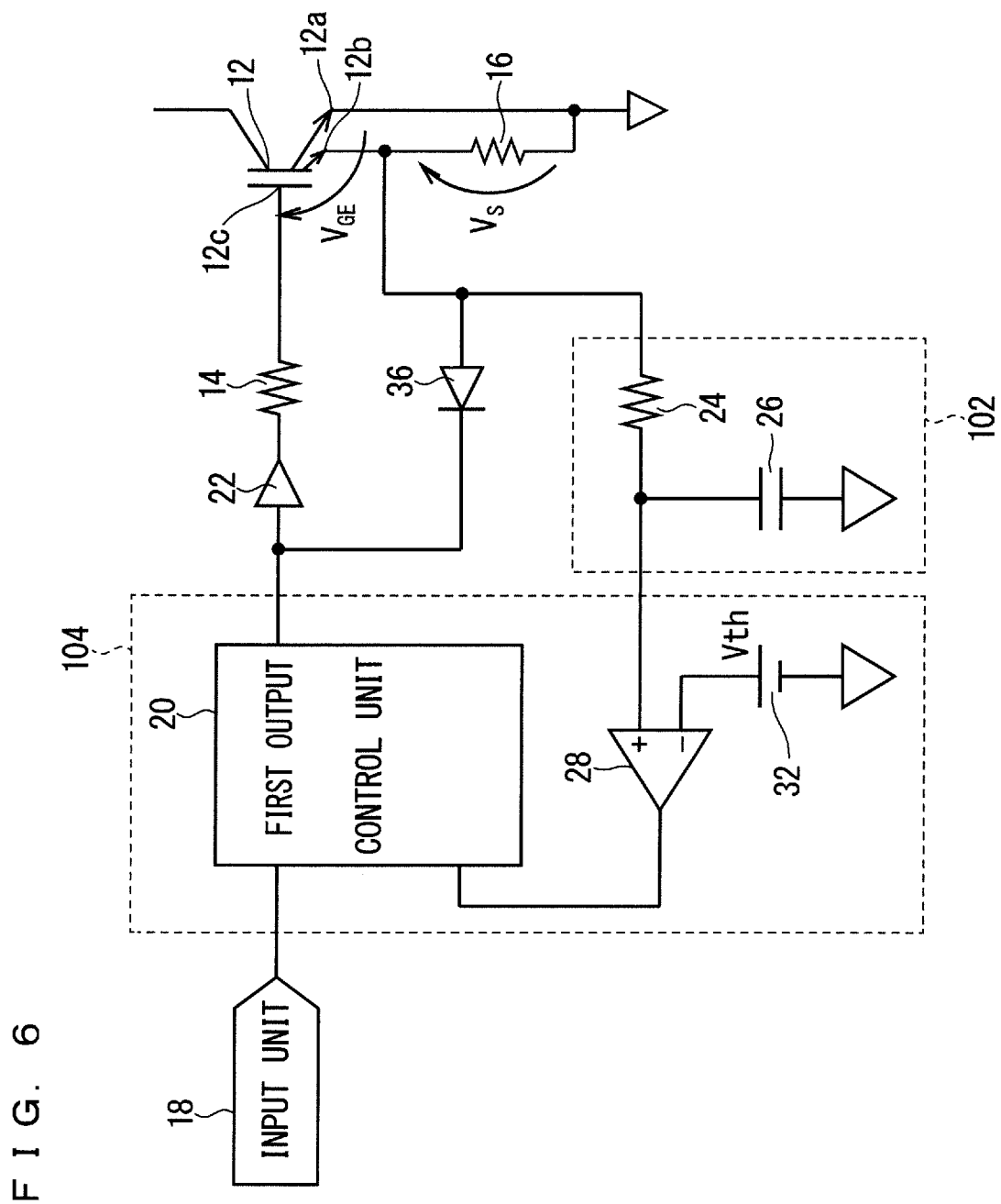
FIG. 6 is a diagram schematically illustrating a circuit configuration for realizing a semiconductor device according to an embodiment.

FIG. 6 is a diagram schematically illustrating a circuit configuration for realizing the semiconductor device according to the present embodiment.

As illustrated in FIG. 6, the semiconductor device includes a semiconductor switching element 12, a gate resistor 14, a sense resistor 16, a buffer circuit 22, a diode 36, a low pass filter 102, and an overcurrent protection circuit 104.

The diode 36 functions as a clamp circuit. The diode 36 branches from a path where a sense voltage $V_S$ is input to the low pass filter 102 while being connected to an anode terminal, and has a cathode terminal connected between a first output of a control unit 20 and the buffer circuit 22. The diode 36 clamps the sense voltage $V_S$ to a voltage obtained by adding a forward voltage $V_F$ to a control signal from the control unit 20 when the semiconductor switching element 12 is off-driven. On the other hand, the semiconductor switching element 12 is on-driven, the diode 36 does not flow a current and does not perform a clamp operation.

When the semiconductor switching element 12 is off-driven, the sense voltage $V_S$ is clamped to the voltage obtained by adding the forward voltage $V_F$ of the diode 36 to the control signal, whereby the number of output terminals and the number of parts can be reduced as compared with a case where a MOSFET or the like is separately provided.

However, since the sense voltage $V_S$ is clamped to the forward voltage $V_F$, for example, a diode having a small forward voltage $V_F$ such as a Schottky barrier diode is desirable as the diode 36.

Figure 7:
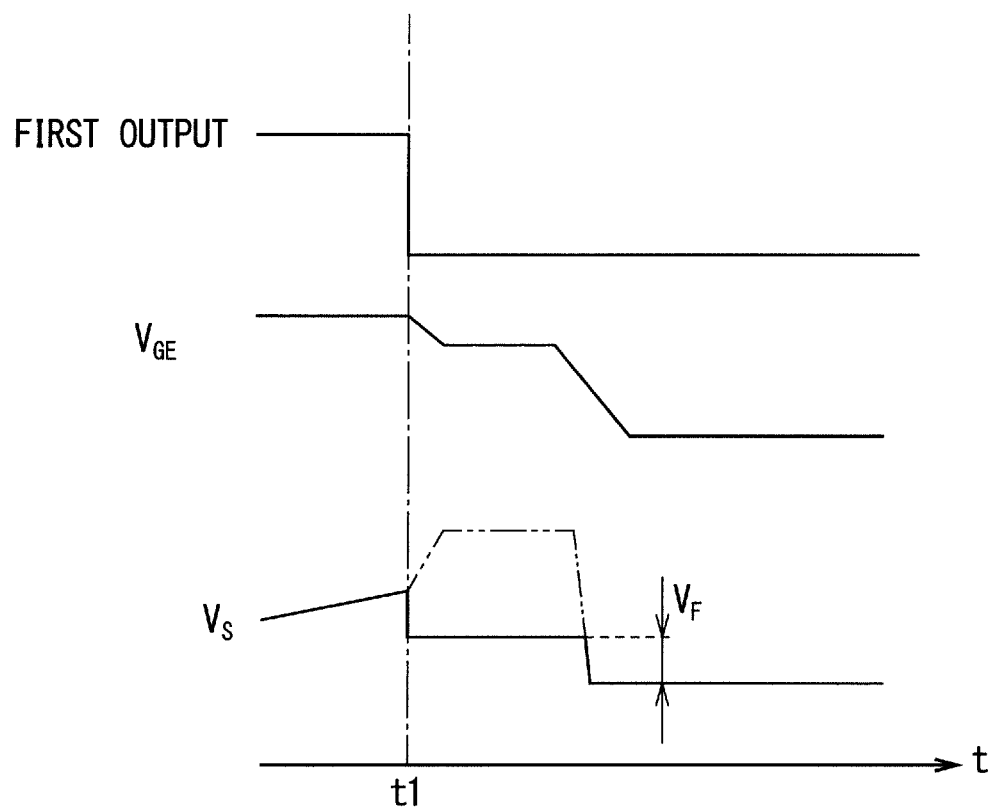
FIG. 7 is a timing chart illustrating an operation of the semiconductor device illustrated in FIG. 6.

FIG. 7 is a timing chart illustrating an operation of the semiconductor device illustrated in FIG. 6. In FIG. 7, a horizontal axis represents time.

As illustrated in FIG. 7, while a Low level voltage signal is output from the first output of the control unit 20, the sense voltage $V_S$ is clamped to the forward voltage $V_F$ of the diode 36 by the diode 36. Therefore, rise of the sense voltage $V_S$ in a mirror period immediately after turn-off of the semiconductor switching element 12 is clamped, and a malfunction of the overcurrent protection circuit can be suppressed.

Note that in a waveform representing a voltage value of the sense voltage $V_S$, a portion represented by a dotted line represents a waveform of the sense voltage $V_S$ when the diode 36 is not provided.

Fourth Embodiment

A semiconductor device according to the present embodiment will be described. In the following description, the same components as those described in the above-described embodiments are denoted by the same reference numerals, and detailed description thereof is appropriately omitted.

<Configuration of Semiconductor Device>

Figure 8:
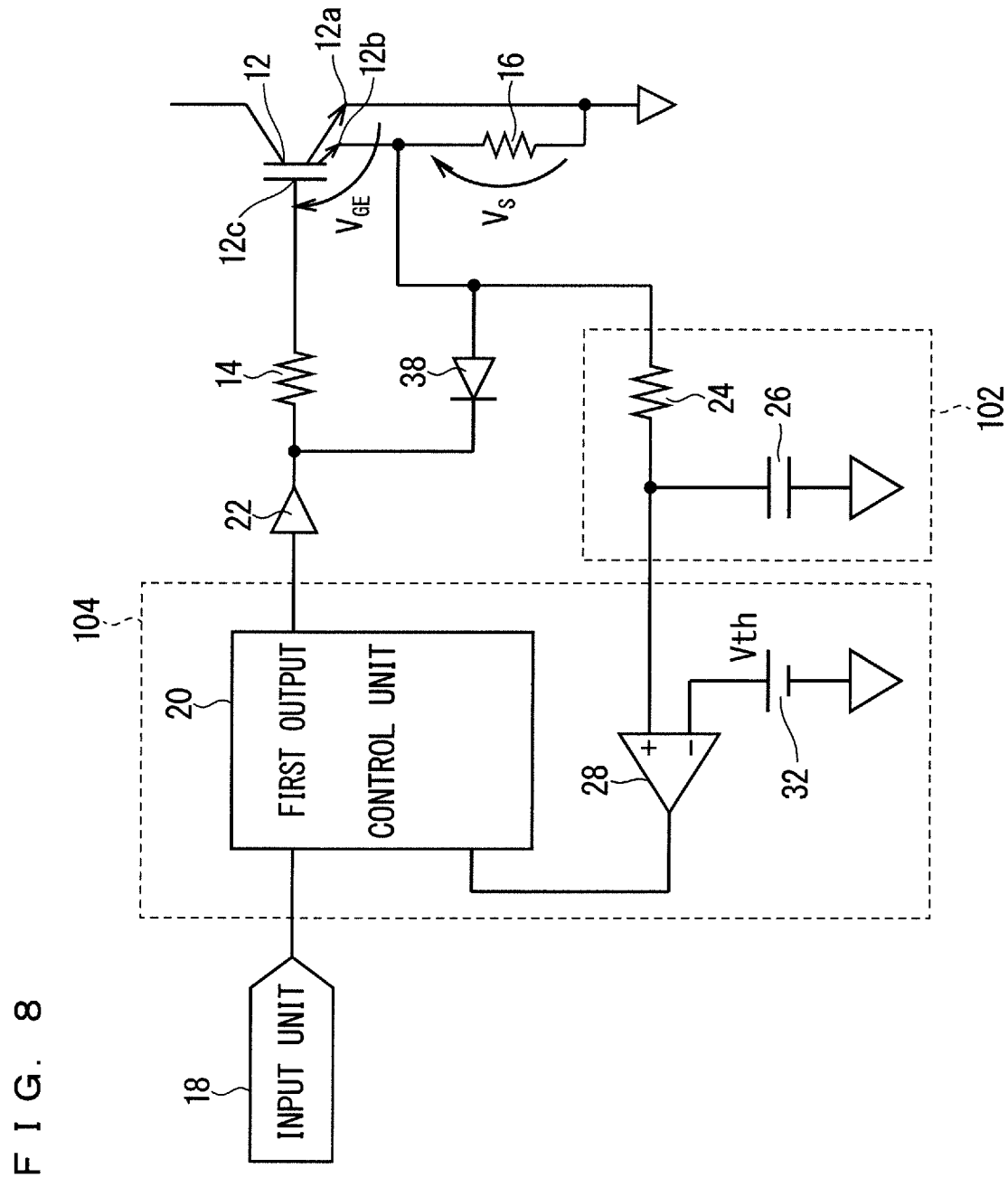
FIG. 8 is a diagram schematically illustrating a circuit configuration for realizing a semiconductor device according to an embodiment.

FIG. 8 is a diagram schematically illustrating a circuit configuration for realizing the semiconductor device according to the present embodiment.

As illustrated in FIG. 8, the semiconductor device includes a semiconductor switching element 12, a gate resistor 14, a sense resistor 16, a buffer circuit 22, a diode 38, a low pass filter 102, and an overcurrent protection circuit 104.

The diode 38 functions as a clamp circuit. The diode 38 branches from a path where a sense voltage $V_S$ is input to the low pass filter 102 while being connected to an anode terminal, and has a cathode terminal connected between the buffer circuit 22 and the gate resistor 14. The diode 38 clamps the sense voltage $V_S$ to a voltage obtained by adding a forward voltage $V_F$ to a driving signal from the buffer circuit 22 when the semiconductor switching element 12 is off-driven. On the other hand, the semiconductor switching element 12 is on-driven, the diode 38 does not flow a current and does not perform a clamp operation.

By clamping the sense voltage $V_S$ based on the forward voltage $V_F$ of the diode 38, the number of output terminals and the number of parts can be reduced as compared with a case where a MOSFET or the like is separately provided.

By performing clamping based on an output signal from the buffer circuit 22, current capability of the clamp circuit can be increased. Here, since the sense voltage $V_S$ is clamped to the sum of the forward voltage $V_F$ of the diode 38 and a voltage drop in the buffer circuit 22, when the voltage drop in the buffer circuit 22 is large, a voltage in which the sense voltage $V_S$ is clamped increases. Therefore, a malfunction prevention function of the overcurrent protection circuit may be weakened.

Figure 9:
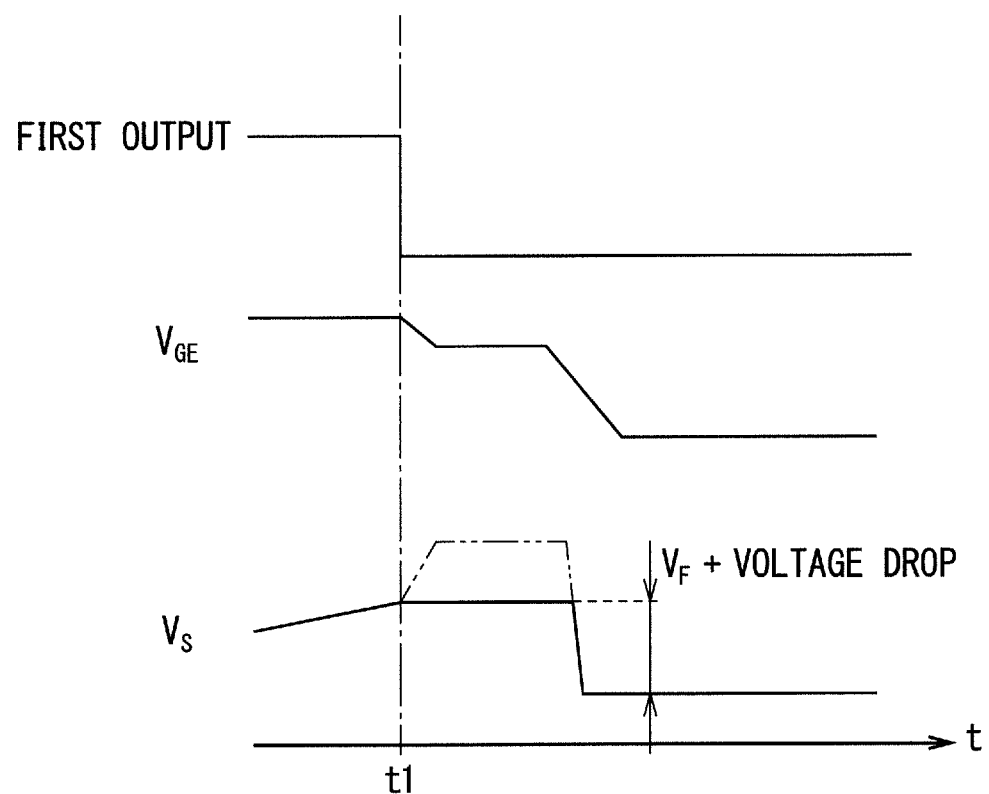
FIG. 9 is a timing chart illustrating an operation of the semiconductor device illustrated in FIG. 8.

FIG. 9 is a timing chart illustrating an operation of the semiconductor device illustrated in FIG. 8. In FIG. 9, a horizontal axis represents time.

As illustrated in FIG. 9, while a Low level voltage signal is output from a first output of a control unit 20, the sense voltage $V_S$ is clamped to the sum of the forward voltage $V_F$ of the diode 38 and the voltage drop in the buffer circuit 22 by the diode 38 and the buffer circuit 22. Therefore, rise of the sense voltage $V_S$ in a mirror period immediately after turn-off of the semiconductor switching element 12 is clamped, and a malfunction of the overcurrent protection circuit can be suppressed.

Note that in a waveform representing a voltage value of the sense voltage $V_S$, a portion represented by a dotted line represents a waveform of the sense voltage $V_S$ when the diode 38 is not provided.

Fifth Embodiment

A semiconductor device according to the present embodiment will be described. In the following description, the same components as those described in the above-described embodiments are denoted by the same reference numerals, and detailed description thereof is appropriately omitted.

<Configuration of Semiconductor Device>

Figure 10:
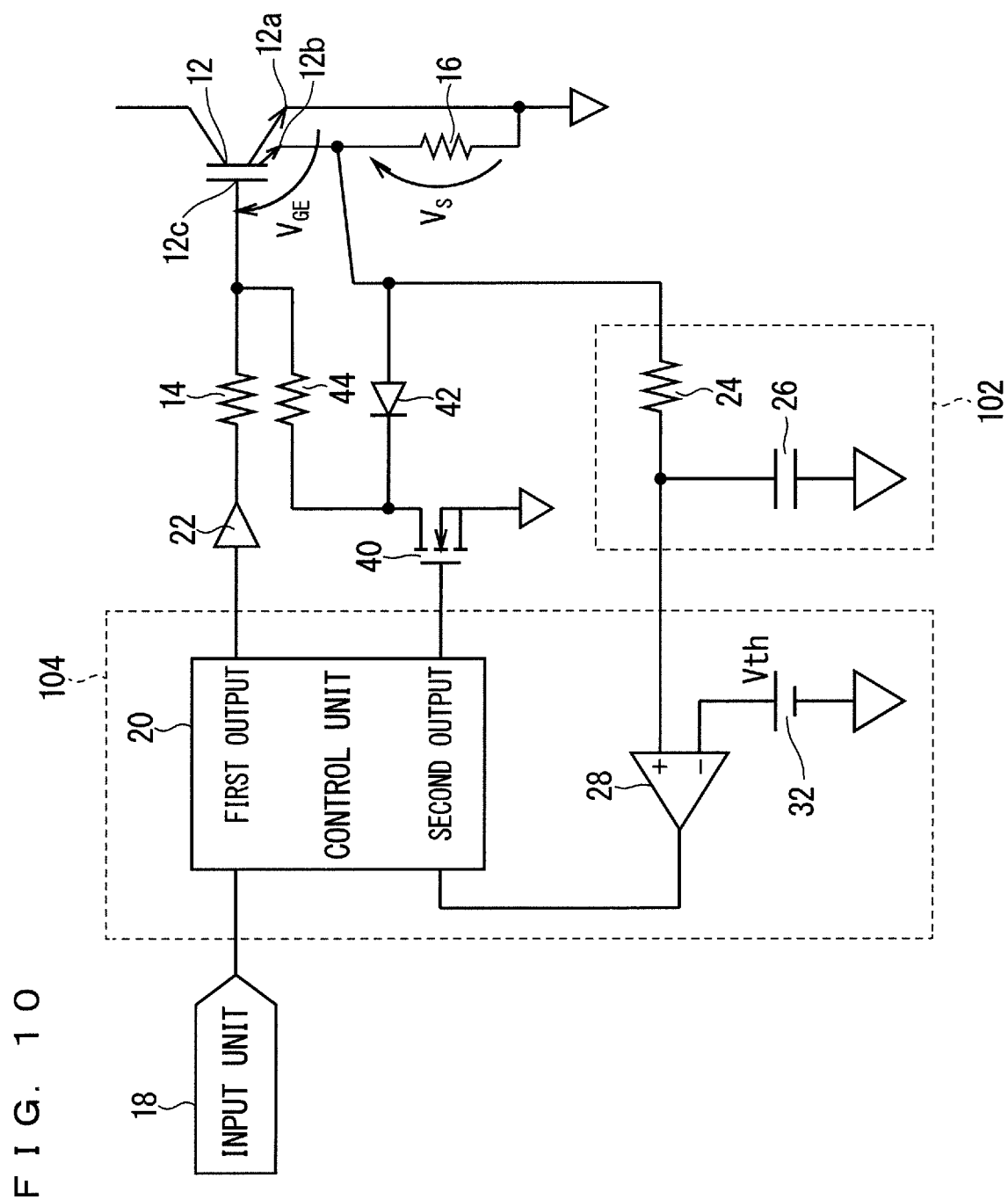
FIG. 10 is a diagram schematically illustrating a circuit configuration for realizing a semiconductor device according to an embodiment.

FIG. 10 is a diagram schematically illustrating a circuit configuration for realizing the semiconductor device according to the present embodiment.

As illustrated in FIG. 10, the semiconductor device includes a semiconductor switching element 12, a gate resistor 14, a sense resistor 16, a buffer circuit 22, a MOSFET 40, a diode 42, a resistor 44, a low pass filter 102, and an overcurrent protection circuit 104.

The diode 42 functions as a clamp circuit. The diode 42 branches from a path where a sense voltage $V_S$ is input to the low pass filter 102 while being connected to an anode terminal, and has a cathode terminal connected to a drain terminal of the MOSFET 40.

The MOSFET 40 has the drain terminal connected to the cathode terminal of the diode 42 and a gate terminal connected to a second output of a control unit 20.

One end of the resistor 44 is connected between a gate terminal 12c of the semiconductor switching element 12 and the gate resistor 14, and another end thereof is connected to the drain terminal of the MOSFET 40.

Figure 11:
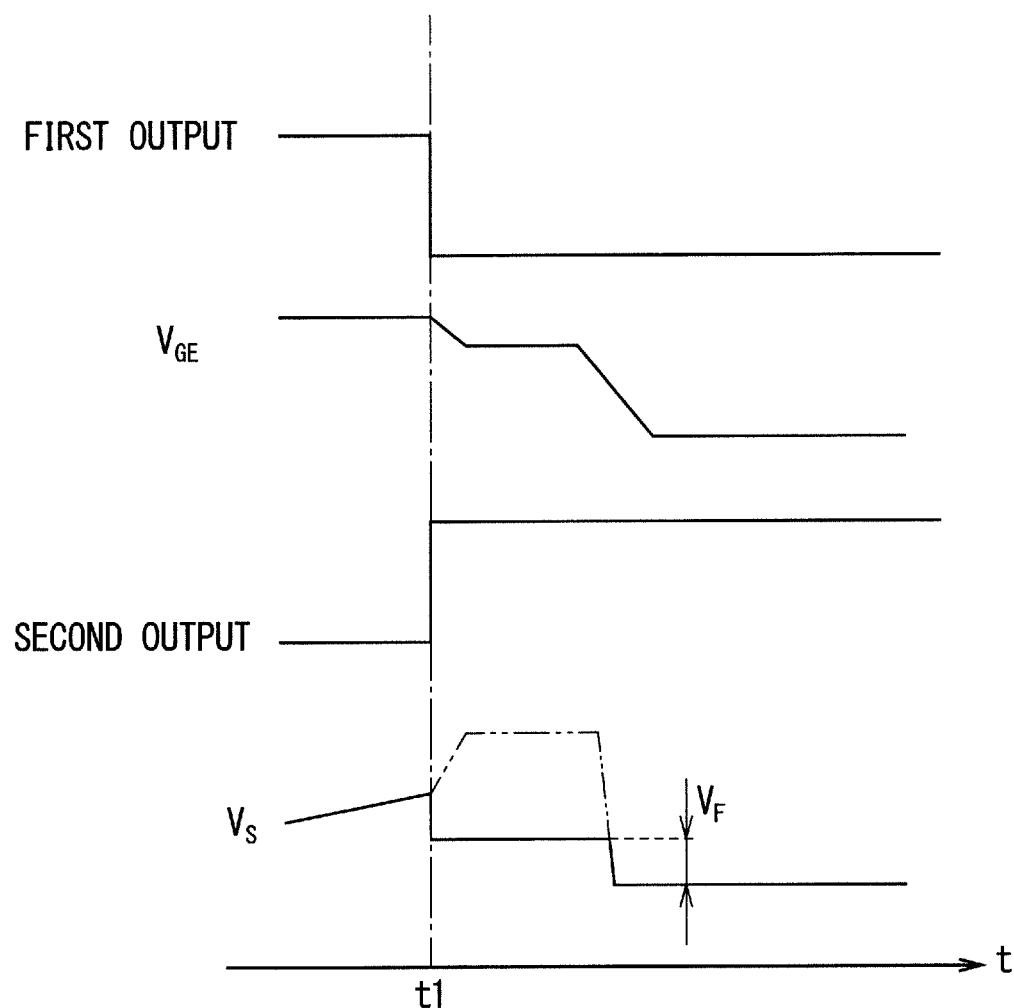
FIG. 11 is a timing chart illustrating an operation of the semiconductor device illustrated in FIG. 10.

FIG. 11 is a timing chart illustrating an operation of the semiconductor device illustrated in FIG. 10. In FIG. 11, a horizontal axis represents time.

As illustrated in FIG. 11, while a Low level voltage signal is output from a first output of the control unit 20, the MOSFET 40 is continuously driven by outputting a High level voltage signal from the second output. By doing so, the sense voltage $V_S$ in a mirror period immediately after the semiconductor switching element 12 is turned off is clamped to a forward voltage $V_F$ of the diode 42, and a malfunction of the overcurrent protection circuit can be suppressed.

Note that in a waveform representing a voltage value of the sense voltage $V_S$, a portion represented by a dotted line represents a waveform of the sense voltage $V_S$ when the clamp circuit does not function.

Sixth Embodiment

A semiconductor device according to the present embodiment will be described. In the following description, the same components as those described in the above-described embodiments are denoted by the same reference numerals, and detailed description thereof is appropriately omitted.

Figure 12:
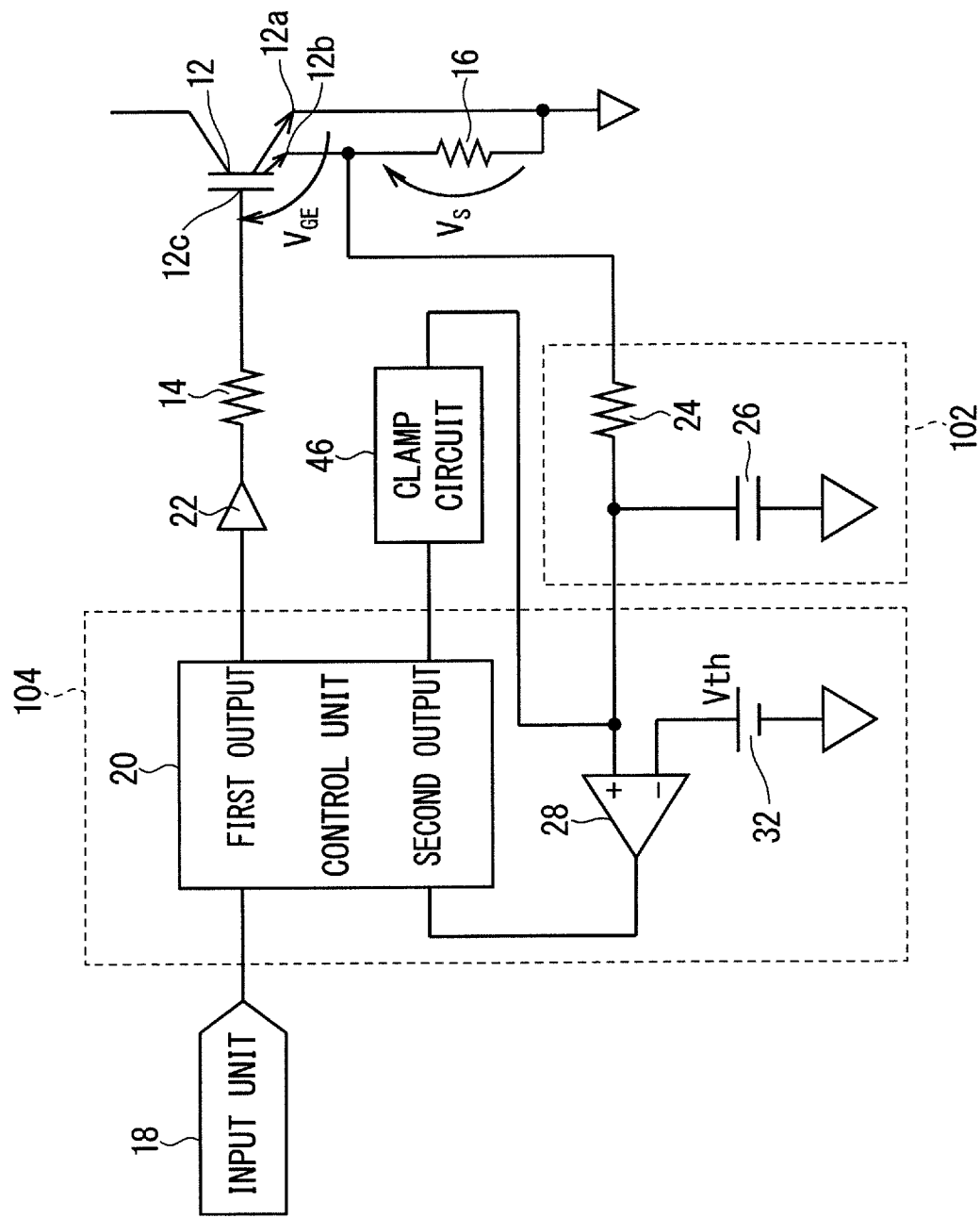
FIG. 12 is a diagram schematically illustrating a circuit configuration for realizing a semiconductor device according to an embodiment.

<Configuration of Semiconductor Device> FIG. 12 is a diagram schematically illustrating a circuit configuration for realizing the semiconductor device according to the present embodiment.

As illustrated in FIG. 12, the semiconductor device includes a semiconductor switching element 12, a gate resistor 14, a sense resistor 16, a buffer circuit 22, a clamp circuit 46, a low pass filter 102, and an overcurrent protection circuit 104.

The clamp circuit 46 is connected between the low pass filter 102 and a comparator 28, and has a gate terminal connected to a second output of a control unit 20. The clamp circuit 46 clamps rise of a sense voltage $V_S$ when a High level voltage signal is input from the second output of the control unit 20.

Seventh Embodiment

A semiconductor device according to the present embodiment will be described. In the following description, the same components as those described in the above-described embodiments are denoted by the same reference numerals, and detailed description thereof is appropriately omitted.

<Operation of Semiconductor Device>

FIG. 13 is a timing chart illustrating an operation of the semiconductor device according to the present embodiment. In FIG. 13, a horizontal axis represents time.

As illustrated in FIG. 13, while a Low level voltage signal is output from a first output of a control unit 20, a clamp circuit is continuously driven by outputting a High level voltage signal from a second output. Furthermore, even after the voltage signal output from the first output of the control unit 20 switches from the Low level voltage signal to a High level voltage signal, the High level voltage signal is output from the second output for a predetermined period.

By doing so, rise of a sense voltage $V_S$ in a mirror period immediately after turn-off of a semiconductor switching element 12 is clamped, and a malfunction of an overcurrent protection circuit can be suppressed. Further, it is possible to suppress a malfunction of the overcurrent protection circuit due to rise of the sense voltage $V_S$ in a mirror period immediately after the semiconductor switching element 12 is turned on.

Note that in a waveform representing a voltage value of the sense voltage $V_S$, a portion represented by a dotted line represents a waveform of the sense voltage $V_S$ when the clamp circuit does not function.

Also, in general, a low pass filter 102 is designed with a time constant capable of sufficiently attenuating the rise of the sense voltage $V_S$ because it suppresses the malfunction of the overcurrent protection due to the rise of the sense voltage $V_S$ in the mirror period when the semiconductor switching element 12 is turned on. Therefore, driving of an overcurrent protection circuit 104 is delayed by the time constant of the low pass filter 102.

In the present embodiment, the sense voltage $V_S$ in the mirror period is clamped by the clamp circuit. Therefore, it is not necessary to attenuate by the low pass filter 102.

Therefore, the low pass filter 102 with a smaller time constant can be used, and reliability of the semiconductor switching element 12 can be enhanced.

However, the overcurrent protection circuit 104 is not driven during a period in which the clamp circuit is driven after the semiconductor switching element 12 is turned on. Therefore, when the semiconductor switching element 12 is in an overcurrent state immediately after the semiconductor switching element 12 is turned on, the delay of the overcurrent protection circuit 104 is increased, and the reliability of the semiconductor switching element 12 may be reduced.

Eighth Embodiment

A semiconductor device according to the present embodiment will be described. In the following description, the same components as those described in the above-described embodiments are denoted by the same reference numerals, and detailed description thereof is appropriately omitted.

<Operation of Semiconductor Device>

Figure 14:
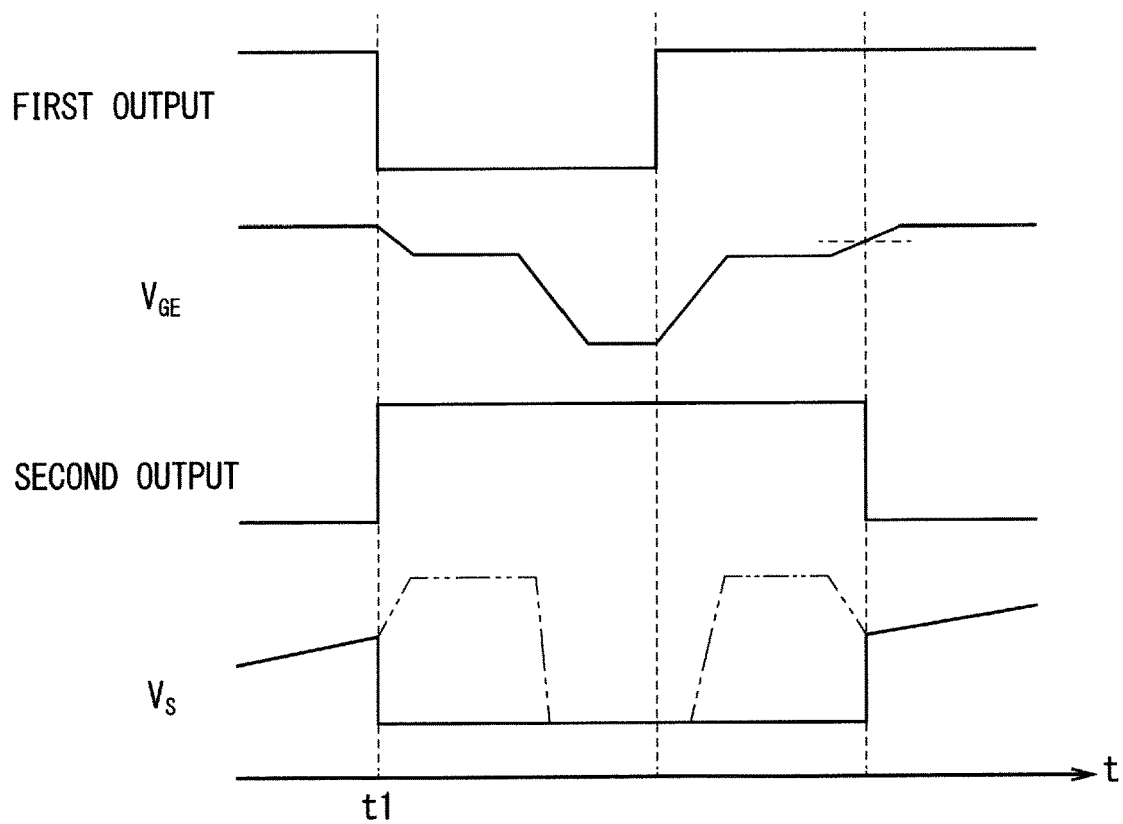
FIG. 14 is a timing chart illustrating an operation of a semiconductor device according to an embodiment.

FIG. 14 is a timing chart illustrating an operation of the semiconductor device according to the present embodiment. In FIG. 14, a horizontal axis represents time.

As illustrated in FIG. 14, while a Low level voltage signal is output from a first output of a control unit 20, a clamp circuit is continuously driven by outputting a High level voltage signal from a second output. Furthermore, even after the voltage signal output from the first output of the control unit 20 switches from the Low level voltage signal to a High level voltage signal, the High level voltage signal is output from the second output until a voltage $V_{GE}$ in a semiconductor switching element 12 which is an IGBT becomes a predetermined voltage value or more.

By doing so, rise of a sense voltage $V_S$ in a mirror period immediately after turn-off of the semiconductor switching element 12 is clamped, and a malfunction of an overcurrent protection circuit can be suppressed. Further, it is possible to suppress a malfunction of the overcurrent protection circuit due to rise of the sense voltage $V_S$ in a mirror period immediately after the semiconductor switching element 12 is turned on.

When the semiconductor switching element 12 is in an overcurrent state immediately after the turn-on, the voltage $V_{GE}$ rises immediately through the parasitic capacitance between a collector and a gate. Then, operation of the clamp circuit is stopped. Therefore, delay of driving of the overcurrent protection circuit is reduced.

Note that in a waveform representing a voltage value of the sense voltage $V_S$, a portion represented by a dotted line represents a waveform of the sense voltage $V_S$ when the clamp circuit does not function.

Ninth Embodiment

A semiconductor device and a power conversion system according to the present embodiment will be described. In the following description, the same components as those described in the above-described embodiments are denoted by the same reference numerals, and detailed description thereof is appropriately omitted.

<Configuration of Semiconductor Device>

In the present embodiment, a case where the semiconductor devices according to the embodiments described above are applied to a power conversion apparatus will be described. Although a case where the semiconductor devices according to the embodiments described above are applied to a three-phase inverter is described below, the semiconductor devices according to the embodiments described above are not limited to such a use.

Figure 15:
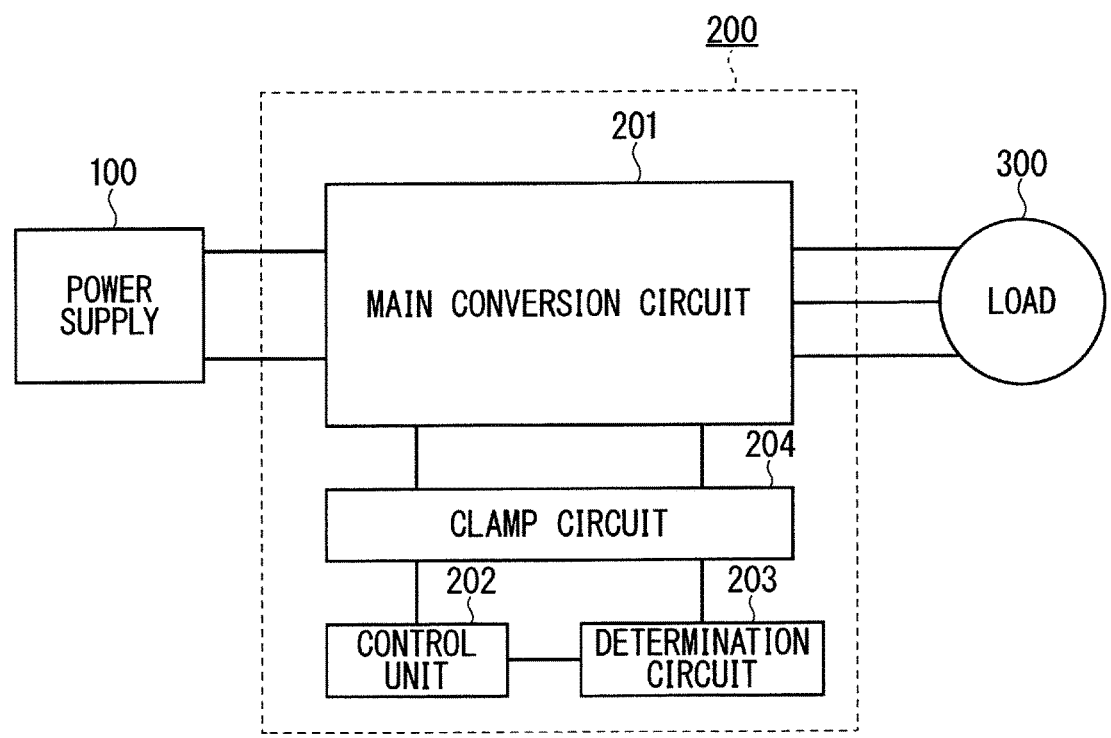
FIG. 15 is a diagram schematically illustrating a configuration of a power conversion system including a power conversion apparatus according to an embodiment.

FIG. 15 is a diagram schematically illustrating a configuration of the power conversion system including the power conversion apparatus according to the present embodiment. Note that, in order to facilitate understanding of the configuration, some components may be omitted or simplified in FIG. 15.

As illustrated in FIG. 15, the power conversion system includes a power supply 100, a power conversion apparatus 200, and a load 300.

The power supply 100 is a DC power supply, and supplies DC power to the power conversion apparatus 200. The power supply 100 can be configured by various things, and can be configured by, for example, a DC system, a solar cell, or a storage battery. The power supply 100 can also be configured by a rectifier circuit connected to an AC system, an AC/DC converter, or the like. Further, the power supply 100 may be configured by a DC/DC converter that converts DC power output from a DC system into predetermined power.

The power conversion apparatus 200 is a three-phase inverter connected between the power supply 100 and the load 300. The power conversion apparatus 200 converts the DC power supplied from the power supply 100 into AC power. Then, the power conversion apparatus 200 supplies the AC power to the load 300.

As illustrated in FIG. 15, the power conversion apparatus 200 includes a main conversion circuit 201, a control unit 202, a determination circuit 203, and a clamp circuit 204.

The main conversion circuit 201 converts DC power into AC power and outputs it. The main conversion circuit 201 is a circuit including a plurality of switching elements. The control unit 202 outputs a control signal for controlling driving of each semiconductor switching element in the main conversion circuit 201.

The determination circuit 203 receives an output from a sense element of each semiconductor switching element, and determines whether an overcurrent flows to the semiconductor switching element. The control unit 202 controls driving of each semiconductor switching element in the main conversion circuit 201 based on an output from the determination circuit 203.

The clamp circuit 204 is provided by straddling between the main conversion circuit 201 and the determination circuit 203, and between the main conversion circuit 201 and the control unit 202. The clamp circuit 204 clamps a sense voltage $V_S$ output from the main conversion circuit 201 in a period in which the semiconductor switching element in the main conversion circuit 201 is off-driven.

The load 300 is, for example, a three-phase electric motor driven by the AC power supplied from the power conversion apparatus 200. Note that the load 300 may be an electric motor mounted on various electric devices which is not limited to a specific application. The load 300 is used, for example, as an electric motor for a hybrid vehicle, an electric vehicle, a railway vehicle, an elevator, or an air conditioner.

Hereinafter, details of the power conversion apparatus 200 will be described. The main conversion circuit 201 includes the semiconductor switching elements and free wheel diodes (not shown here). By switching of the semiconductor switching elements, the main conversion circuit 201 converts the DC power supplied from the power supply 100 into the AC power, and further supplies it to the load 300.

Although various circuits are assumed as a specific circuit configuration of the main conversion circuit 201, the main conversion circuit 201 according to the present embodiment is a two-level three-phase full bridge circuit, and can include six semiconductor switching elements and six free wheel diodes disposed in the semiconductor switching elements in an antiparallel manner.

The six semiconductor switching elements are connected in series for every two semiconductor switching elements to constitute an upper and lower arm. Each upper and lower arm constitutes each phase of a full bridge circuit, that is, a U phase, a V phase, and a W phase. Output terminals of the upper and lower arms, that is, three output terminals of the main conversion circuit 201, are connected to the load 300.

The control unit 202 generates the control signal for controlling driving of each semiconductor switching element in the main conversion circuit 201. Then, the control unit 202 supplies the control signal to a control electrode of the semiconductor switching element of the main conversion circuit 201.

Specifically, a driving signal for turning on each semiconductor switching element in the main conversion circuit 201 and a driving signal for turning off each semiconductor switching element in the main conversion circuit 201 are output to the control electrode of each semiconductor switching element.

When the semiconductor switching element is maintained in an on state, the driving signal is a voltage signal equal to or higher than a threshold voltage of the semiconductor switching element, that is, an on signal. Further, when the semiconductor switching element is maintained in an off state, the driving signal is a voltage signal equal to or lower than the threshold voltage of the semiconductor switching element, that is, an off signal.

The determination circuit 203 has a function of protecting the semiconductor switching element of the main conversion circuit 201 from an overcurrent state. Specifically, an output value of the sense element having a correlation with a current flowing through each semiconductor switching element in the main conversion circuit 201 is input to the determination circuit 203. Then, when the output value exceeds a predetermined threshold value, the determination circuit 203 determines that the semiconductor switching element in the main conversion circuit 201 is in the overcurrent state. Then, the determination circuit 203 outputs, to the control unit 202, a signal for blocking a gate of the semiconductor switching element.

The control unit 202 controls driving of the semiconductor switching element in the main conversion circuit 201 so that desired power is supplied to the load 300. Specifically, based on the power to be supplied to the load 300, the control unit 202 calculates time during which each semiconductor switching element of the main conversion circuit 201 should be turned on, that is, on time.

For example, the control unit 202 can control driving of the semiconductor switching element in the main conversion circuit 201 by pulse width modulation (that is, PWM) control that modulates on time of the semiconductor switching element according to a voltage to be output.

Then, the control unit 202 outputs, at each point in time, the on signal to the semiconductor switching element to be turned on and the off signal to the semiconductor switching element to be turned off.

The power conversion apparatus according to the present embodiment includes the clamp circuit 204 having the same configuration as the clamp circuit exemplified in any of the above-described embodiments. Therefore, by the operation of the clamp circuit 204, reliability of the semiconductor switching element can be enhanced while suppressing a malfunction in the determination circuit 203 and a malfunction in the control unit 202.

Although a case where the semiconductor device is applied to the two-level three-phase inverter has been described in the present embodiment, the application of the semiconductor device according to the present embodiment is not limited to this, and can be applied to various power conversion apparatuses, for example.

Although the case where the semiconductor device is applied to the two-level three-phase inverter has been described in the present embodiment, the semiconductor device according to the present embodiment may be applied to a three-level or multi-level power conversion apparatus, or in the case of supplying power to a single-phase load, the semiconductor device according to the present embodiment may be applied to a single-phase inverter.

Further, in the case of supplying power to a DC load or the like, the semiconductor device according to the present embodiment may be applied to a DC/DC converter or an AC/DC converter.

Further, in a case where the semiconductor device according to the present embodiment is applied to the power conversion apparatus, it is not limited to a case where the load described above is the electric motor, and for example, it can be used as a power supply apparatus of a power supply system of an electric discharge machine, a laser processing machine, an induction heating cooker, or a non-contactor, and can also be used as a power conditioner of a solar power generation system, a storage system, or the like.

<About Effects Produced by Embodiments Described Above>

Next, effects produced by the embodiments described above are exemplified. Note that, in the following description, although the effects are described based on the specific configurations exemplified in the embodiments described above, as long as the same effects are produced, the configurations may be replaced with other specific configurations exemplified in the present specification.

Further, the replacement may be performed on a plurality of embodiments. In other words, there may be a case where configurations illustrated in different embodiments are combined to produce the same effects.

According to the embodiment described above, a semiconductor device includes a semiconductor switching element 12, a sense resistor 16, an overcurrent protection circuit 104, and a diode 36. The sense resistor 16 converts a sense current divided from a main current flowing to the semiconductor switching element 12 into a voltage. The overcurrent protection circuit 104 outputs a control signal for controlling on-drive and off-drive of the semiconductor switching element 12 based on whether a sense voltage $V_S$ exceeds a predetermined threshold value. The diode 36 clamps the sense voltage $V_S$ to a voltage obtained by adding a forward voltage to a voltage of a signal output from the overcurrent protection circuit 104 to the semiconductor switching element 12 at a time of off-drive. Then, when the sense voltage $V_S$ does not exceed the threshold value, based on an input signal, the overcurrent protection circuit 104 outputs a signal for on-driving or a signal for off-driving the semiconductor switching element 12 as the control signal. In addition, when the sense voltage $V_S$ exceeds the threshold value, the overcurrent protection circuit 104 outputs the signal for off-driving the semiconductor switching element 12 as the control signal.

According to such a configuration, it is possible to suppress a malfunction of the overcurrent protection circuit 104 caused by rise of the sense voltage $V_S$ in a mirror period immediately after the semiconductor switching element 12 is turned off. Specifically, while the signal for off-driving the semiconductor switching element 12 is output by the overcurrent protection circuit 104, the diode 36 clamps the sense voltage $V_S$ based on the signal, so that the malfunction of the overcurrent protection circuit 104 due to the rise of the sense voltage $V_S$ in the period after the turn-off of the semiconductor switching element 12 is suppressed. In addition, since the sense voltage $V_S$ is clamped using the signal output from the overcurrent protection circuit 104 to the semiconductor switching element 12 at the time of off-drive, the number of output terminals and the number of parts can be reduced as compared with a case where a clamp circuit for clamping a sense voltage is separately mounted.

Note that other configurations exemplified in the present specification other than these configurations can be omitted suitably. In other words, as long as at least these configurations are included, the effects described above can be produced.

However, when at least one of the other configurations exemplified in the present specification is appropriately added to the configuration described above, that is, even when the other configuration exemplified in the present specification which is not described as the configuration described above is added to the above-described configuration, the effects described above can be similarly produced.

Further, according to the embodiment described above, the diode 36 clamps the sense voltage $V_S$ to the voltage obtained by adding the forward voltage to the control signal.

According to such a configuration, since the sense voltage $V_S$ is clamped using the control signal output from the overcurrent protection circuit 104, the number of output terminals and the number of parts can be reduced more than the case where the clamp circuit for clamping the sense voltage is separately mounted.

Further, according to the embodiment described above, a semiconductor device includes a buffer circuit 22 that outputs a driving signal for driving a semiconductor switching element 12 based on a control signal output from an overcurrent protection circuit 104. Further, a diode 38 clamps a sense voltage $V_S$ to a voltage obtained by adding a forward voltage to the driving signal. According to such a configuration, by performing clamping based on the output signal from the buffer circuit 22, current capability of the clamp circuit can be increased.

Further, according to the embodiment described above, a semiconductor device includes a MOSFET 40. The MOSFET 40 is provided between a diode 42 and an overcurrent protection circuit 104. Further, a drain terminal of the MOSFET 40 is a gate sink output, is connected to a gate terminal 12c of a switching element 12 through a resistor 44, and is connected to a cathode of the diode 42. Further, a signal from the overcurrent protection circuit 104 is input to a gate terminal of the MOSFET 40. Also, a source terminal of the MOSFET 40 is connected to ground. Further, the diode 42 clamps a sense voltage $V_S$ to a forward voltage while the MOSFET 40 is driven. According to such a configuration, when a gate sink current path is provided separately from a main drive output, by connecting the gate sink output and the diode 42, a clamp circuit can be implemented while an increase in the number of parts is suppressed.

Further, according to the embodiment described above, a power conversion apparatus 200 including the above-described semiconductor device, a power supply 100 connected to the power conversion apparatus 200, and a load 300 are provided. The load 300 is connected to the power conversion apparatus 200, and an output of the power supply 100 is input to the load 300 after being converted in the power conversion apparatus 200. According to such a configuration, the power conversion apparatus 200 includes the above-described semiconductor device including the diode. Therefore, by the operation of the diode, reliability of a semiconductor switching element can be enhanced while suppressing a malfunction in a determination circuit 203 and a malfunction in a control unit 202.

Further, according to the embodiment described above, a semiconductor device includes a semiconductor switching element 12, a sense resistor 16, a clamp circuit 30, a determination circuit, and a control unit 20. The sense resistor 16 converts a sense current divided from a main current flowing to the semiconductor switching element 12 into a voltage. The clamp circuit 30 clamps a sense voltage $V_S$. The determination circuit determines whether the sense voltage $V_S$ exceeds a predetermined threshold value. The control unit 20 controls on-drive and off-drive of the semiconductor switching element 12 based on a determination result in the determination circuit. Further, the control unit 20 controls drive of the clamp circuit 30 based on the determination result in the determination circuit. Then, when the sense voltage $V_S$ does not exceed the threshold value, the control unit 20 on-drives or off-drives the semiconductor switching element 12 based on an input signal. Further, when the sense voltage $V_S$ exceeds the threshold value, the control unit 20 off-drives the semiconductor switching element 12. In addition, the control unit 20 causes the clamp circuit 30 to clamp the sense voltage $V_S$ at least during a period when the semiconductor switching element 12 is off-driven and a predetermined period after the period. Here, the determination circuit corresponds to, for example, a comparator 28.

According to such a configuration, it is possible to suppress a malfunction of an overcurrent protection circuit 104 caused by rise of the sense voltage $V_S$ in a mirror period immediately after the semiconductor switching element 12 is turned off and also a malfunction of the overcurrent protection circuit 104 caused by rise of the sense voltage $V_S$ in a mirror period immediately after the semiconductor switching element 12 is turned on.

Note that other configurations exemplified in the present specification other than these configurations can be omitted suitably. In other words, as long as at least these configurations are included, the effects described above can be produced.

However, when at least one of the other configurations exemplified in the present specification is appropriately added to the configuration described above, that is, even when the other configuration exemplified in the present specification which is not described as the configuration described above is added to the above-described configuration, the effects described above can be similarly produced.

Moreover, according to the embodiment described above, a semiconductor switching element 12 is an IGBT. Then, during a period in which the semiconductor switching element 12 is off-driven, and during a period after that period until a voltage value between a gate and an emitter of the semiconductor switching element 12 becomes equal to or higher than a voltage value predetermined for the semiconductor switching element 12, a control unit 20 causes a clamp circuit 30 to clamp a sense voltage $V_S$. According to such a configuration, rise of the sense voltage $V_S$ in a mirror period immediately after turn-off of the semiconductor switching element 12 is clamped, and a malfunction of an overcurrent protection circuit can be suppressed. Further, it is possible to suppress a malfunction of the overcurrent protection circuit due to rise of the sense voltage $V_S$ in a mirror period immediately after the semiconductor switching element 12 is turned on. When the semiconductor switching element 12 is in an overcurrent state immediately after the turn-on, a voltage $V_{GE}$ rises immediately through the parasitic capacitance between a collector and the gate. Then, operation of the clamp circuit is stopped. Therefore, delay of driving of the overcurrent protection circuit is reduced.

Further, according to the embodiment described above, the clamp circuit is a MOSFET 34. A sense voltage $V_S$ is input to a drain terminal of the MOSFET 34. Further, a signal from a control unit 20 is input to a gate terminal of the MOSFET 34. Also, a source terminal of the MOSFET 34 is connected to ground. According to such a configuration, it is possible to appropriately suppress a malfunction of an overcurrent protection circuit 104 caused by rise of a sense voltage $V_S$ in a mirror period immediately after a semiconductor switching element 12 is turned off, and also a malfunction of the overcurrent protection circuit 104 caused by rise of the sense voltage $V_S$ in a mirror period immediately after the semiconductor switching element 12 is turned on.

Further, according to the embodiment described above, a semiconductor device includes a low pass filter 102 to which a sense voltage $V_S$ is input. Then, a comparator 28 determines whether the sense voltage $V_S$ input through the low pass filter 102 exceeds a threshold value. Also, a clamp circuit 46 clamps the sense voltage $V_S$ input to the comparator 28 via the low pass filter 102. According to such a configuration, it is possible to appropriately suppress a malfunction of an overcurrent protection circuit 104 caused by rise of the sense voltage $V_S$ in a mirror period immediately after a semiconductor switching element 12 is turned off, and also a malfunction of the overcurrent protection circuit 104 caused by rise of the sense voltage $V_S$ in a mirror period immediately after the semiconductor switching element 12 is turned on.

Further, according to the embodiment described above, a power conversion apparatus 200 including the above-described semiconductor device, a power supply 100 connected to the power conversion apparatus 200, and a load 300 are provided. The load 300 is connected to the power conversion apparatus 200, and an output of the power supply 100 is input to the load 300 after being converted in the power conversion apparatus 200. According to such a configuration, the power conversion apparatus 200 includes the above-described semiconductor device including the clamp circuit. Therefore, by the operation of the clamp circuit, reliability of a semiconductor switching element can be enhanced while suppressing a malfunction in a determination circuit 203 and a malfunction in a control unit 202.

Modifications of Embodiments Described Above

Although material qualities, materials, dimensions, shapes, relative arrangement relationships of components, conditions of implementation, etc. may also be described in the embodiments described above, these are exemplifications in all aspects, and are not limited to those described in the present specification.

Accordingly, numerous modifications and equivalents not exemplified are contemplated within the scope of the technique disclosed in the present specification. For example, a case where at least one component is deformed, added or omitted, and further, a case where at least one component in at least one embodiment is extracted and combined with components of another embodiment shall be included.

Also, as long as no contradiction arises, it is assumed that "one or more" may be provided for the component described as being "one" in the embodiment described above.

Furthermore, each component in the embodiment described above is a conceptual unit, and within the scope of the technique disclosed in the present specification, a case where one component is composed of a plurality of structures, a case where one component corresponds to a part of a certain structure, and furthermore, a case where plural components are provided in one structure are included.

In addition, each component in the embodiment described above includes a structure having another structure or shape as long as the same function is exerted.

In addition, the description in the present specification is referred to for all purposes relating to the present technique, none of which is deemed to be prior art.

EXPLANATION OF REFERENCE SIGNS

12: semiconductor switching element
12a: emitter terminal
12b: current sense terminal
12c: gate terminal
14: gate resistor
16: sense resistor
18: input unit
20, 202: control unit
22: buffer circuit
24, 44: resistor
26: capacitor
28: comparator
30, 46, 204: clamp circuit
32: reference voltage source
34, 40: MOSFET
36, 38, 42: diode
100: power supply
102: low pass filter
104: overcurrent protection circuit
200: power conversion apparatus
201: main conversion circuit
203: determination circuit
300: load
t1, t2: time
$V_F$: forward voltage
$V_S$: sense voltage

The invention claimed is:

1. A semiconductor device comprising:
a semiconductor switching element;
a sense resistor which converts a sense current divided from a main current flowing to the semiconductor switching element into a sense voltage;
an overcurrent protection circuit which outputs a control signal for controlling on-drive and off-drive of the semiconductor switching element based on whether the sense voltage exceeds a predetermined threshold value;
a diode which clamps the sense voltage to a voltage obtained by adding a forward voltage to a voltage of a signal output from the overcurrent protection circuit to the semiconductor switching element at a time of off-drive; and
a MOSFET provided between the diode and the overcurrent protection circuit, wherein
a cathode of the diode is connected to a drain terminal of the MOSFET,
a signal from the overcurrent protection circuit is input to a gate terminal of the MOSFET,
a source terminal of the MOSFET is connected to ground, and
the overcurrent protection circuit,
outputs, based on an input signal, a signal for on-driving or a signal for off-driving the semiconductor switching element as the control signal when the sense voltage does not exceed the threshold value, and
outputs a signal for off-driving the semiconductor switching element as the control signal when the sense voltage exceeds the threshold value.

2. A semiconductor device comprising:
a semiconductor switching element;
a sense resistor which converts a sense current divided from a main current flowing to the semiconductor switching element into a sense voltage;
an overcurrent protection circuit which outputs a control signal for controlling on-drive and off-drive of the semiconductor switching element based on whether the sense voltage exceeds a predetermined threshold value; and
a diode which clamps the sense voltage to a voltage obtained by adding a forward voltage to a voltage of a signal output from the overcurrent protection circuit to the semiconductor switching element at a time of off-drive, wherein
the diode clamps the sense voltage to a voltage obtained by adding a forward voltage to the control signal, and the overcurrent protection circuit:
outputs, based on an input signal, a signal for on-driving or a signal for off-driving the semiconductor switching element as the control signal when the sense voltage does not exceed the threshold value, and
outputs a signal for off-driving the semiconductor switching element as the control signal when the sense voltage exceeds the threshold value.

3. The semiconductor device according to claim 1, further comprising:
a buffer circuit which outputs a driving signal for driving the semiconductor switching element based on the control signal output from the overcurrent protection circuit,
wherein the diode clamps the sense voltage to a voltage obtained by adding a forward voltage to the driving signal.

4. The semiconductor device according to claim 1,
wherein the diode clamps the sense voltage to a forward voltage.

5. A power conversion system comprising:
a power conversion apparatus including the semiconductor device according to claim 1;
a power supply connected to the power conversion apparatus; and
a load connected to the power conversion apparatus, and an output of the power supply being input after being converted in the power conversion apparatus.

6. A semiconductor device comprising:
a semiconductor switching element;
a sense resistor which converts a sense current divided from a main current flowing to the semiconductor switching element into a sense voltage;
a clamp circuit which clamps the sense voltage;
a determination circuit which determines whether the sense voltage exceeds a predetermined threshold value; and
a control unit which controls on-drive and off-drive of the semiconductor switching element and drive of the clamp circuit based on a determination result in the determination circuit,
wherein the control unit,
on-drives or off-drives the semiconductor switching element based on an input signal when the sense voltage does not exceed the threshold value,
off-drives the semiconductor switching element when the sense voltage exceeds the threshold value, and
causes the clamp circuit to clamp the sense voltage at least during a period when the semiconductor switching element is off-driven and a predetermined period after the period.

7. The semiconductor device according to claim 6, wherein
the semiconductor switching element is an IGBT, and
the control unit,
causes the clamp circuit to clamp the sense voltage during a period when the semiconductor switching element is off-driven and a period after the period until a voltage value between a gate and an emitter of the semiconductor switching element becomes equal to or greater than a voltage value predetermined for the semiconductor switching element.

8. The semiconductor device according to claim 6, wherein
the clamp circuit is a MOSFET,
the sense voltage is input to a drain terminal of the clamp circuit,
a signal from the control unit is input to a gate terminal of the clamp circuit, and
a source terminal of the clamp circuit is connected to ground.

9. The semiconductor device according to claim 6, further comprising:
a low pass filter to which the sense voltage is input,
wherein the determination circuit determines whether the sense voltage input through the low pass filter exceeds the threshold value, and
the clamp circuit clamps the sense voltage input to the determination circuit through the low pass filter.

10. A power conversion system comprising:
a power conversion apparatus including the semiconductor device according to claim 6;
a power supply connected to the power conversion apparatus; and
a load connected to the power conversion apparatus, and an output of the power supply being input after being converted in the power conversion apparatus.

* * * * *